United States Patent [19]

Edamatsu et al.

[11] Patent Number: 5,428,756
[45] Date of Patent: Jun. 27, 1995

[54] PIPELINED COMPUTER WITH CONTROL OF INSTRUCTION ADVANCE

[75] Inventors: Hisakazu Edamatsu, Osaka; Hitoshi Yamashita, Nara, both of Japan

[73] Assignee: Matsushita Electric Industrial Co., Ltd., Osaka, Japan

[21] Appl. No.: 90,444

[22] Filed: Jul. 12, 1993

Related U.S. Application Data

[63] Continuation of Ser. No. 580,718, Sep. 11, 1990, abandoned.

[30] Foreign Application Priority Data

Sep. 25, 1989 [JP] Japan .................................. 1-248328

[51] Int. Cl.⁶ .............................................. G06F 9/38
[52] U.S. Cl. ............................. 395/375; 364/DIG. 1
[58] Field of Search ........................ 395/375, 800

[56] References Cited

U.S. PATENT DOCUMENTS

| | | | |
|---|---|---|---|
| 4,270,181 | 5/1981 | Tanakura et al. | 395/775 |
| 4,594,655 | 6/1986 | Hao et al. | 395/775 |
| 4,750,112 | 6/1988 | Jones et al. | 395/375 |
| 4,916,652 | 4/1990 | Schwarz et al. | 395/375 |
| 5,006,980 | 4/1991 | Sanders et al. | 395/550 |
| 5,193,158 | 3/1993 | Kinney et al. | 395/375 |

OTHER PUBLICATIONS

Microprocessing and Microprogramming. vol. 24, No. 1/5, Aug. 1988, Amsterdam NL, pp. 695–700, V. G. Oklobdzija 'Issues in CPU—Coprocessor Communication and synchronisation'.

*Primary Examiner*—Parshotam S. Lall
*Assistant Examiner*—Richard Lee Ellis
*Attorney, Agent, or Firm*—Lowe, Price, LeBlanc & Becker

[57] ABSTRACT

An instruction is fed to first and second pipelines at a same time. The instruction is advanced in the first pipeline. In addition, the instruction is advanced in the second pipeline. Advance of the instruction in the second pipeline is controlled in accordance with a position of the instruction in the first pipeline to synchronize advance of the instruction in the first pipeline and advance of the instruction in the second pipeline.

20 Claims, 26 Drawing Sheets

FIG. 3

| STAGE NAME | ORIGINAL CONDITION | (TOX,TOY,TOZ) | | | |
|---|---|---|---|---|---|
| | | (1,1,1) | (0,1,1) | (0,0,1) | (0,0,0) |
| INSTRUCTION FEED | C | D | C | C | C |
| X2 STAGE | B | C | NOP | B | B |
| Y1 STAGE | B | C | NOP | B | B |
| Y2 STAGE | A | B | B | NOP | A |
| Z1 STAGE | A | B | B | NOP | A |

FIG. 6

| STAGE NAME | ORIGINAL CONDITION | (A1SEL, B1SEL, C1SEL) | | | |
|---|---|---|---|---|---|
| | | (1,1,1) | (0,1,1) | (2,0,1) | (2,2,0) |
| INSTRUCTION FEED | D | E | D | D | D |
| A2 STAGE | C | D | NOP | C | C |
| B1 STAGE | C | D | NOP | C | C |
| B2 STAGE | B | C | C | NOP | B |
| C1 STAGE | B | C | C | NOP | B |
| C2 STAGE | A | B | B | B | NOP |
| D1 STAGE | A | B | B | B | NOP |

PIPELINED COMPUTER WITH CONTROL OF INSTRUCTION ADVANCE

This application is a continuation of application Ser. No. 07/580,718 filed Sep. 11, 1990 now abandoned.

BACKGROUND OF THE INVENTION

1. Field of the Invention

This invention relates to a pipelined computer and methods in the same.

2. Description of the Prior Art

In a pipelined computer having instruction pipelines of different types, the instruction pipelines sometimes spend different respective times in execution of respective instructions. In such a case, although a slight change in the sequence of actual execution of instructions is allowed, the contents of registers in the computer are required to be updated in the same sequence as the sequence of execution of the instructions. Controlling the sequence of completion of execution of instructions referred to as establishing the synchronization between the pipelines.

Prior art methods of synchronization in a pipelined computer will be listed in the following.

1) Asynchronous: Controlled units are not synchronized with each other, and communication between the units is performed via flags and handshakes.

2) Horizontal Control: A composite instruction controls the operation of setting different units at respective clock periods. A long instruction is divided into a large number of fields. Processors are parallelly and independently controlled by the respective fields, and thereby the synchronization between the processors is established. When the degree of the parallel is low, the efficiency of bit use of the instruction is small. It is necessary to prepare a process of judging the possibility of parallel processing during the instruction execution, or a process of extracting the possibility of parallel processing during the instruction compiling. Thus, in the case where the controls of the processors are determined in accordance with the results of the processings by the processors respectively, the instruction is rearranged and then the instruction is required to be decoded, thereby necessitating expenditure of additional time.

3) Lockstep: A set of equal processors is synchronously controlled so that the processors will simultaneously execute equal processings.

4) Issue-When-Ready: As soon as a required unit or register becomes free, an instruction is transmitted to an execution unit.

The prior art methods 1)–3) have problems as follows. The prior art method 1) is unsuited to the realization of high-speed synchronization since a handshake spends a considerable time. In the case where an exception occurs in a controlled unit and simultaneously the execution of an instruction in another controlled unit needs to be interrupted, it is difficult for the prior art method 1) to realize a method of disabling the processing of the instruction at a high speed. In the prior art method 2), since all units are controlled by a common horizontal instruction, the units can not operate independently and also processors can not be operated independently. In the prior art method 2), since the execution times of the processors are sometimes different, the process of disabling the processing of the instruction tends to be complicated during the occurrence of an exception in one of the processors. The prior art method 3) requires units to be equal. The prior art method 3) can not be applied to the case where units independently execute different operations although the units are equal.

SUMMARY OF THE INVENTION

It is an object of this invention to provide a good pipelined computer.

It is another object of this invention to provide improved methods in a pipelined computer.

A first aspect of this invention provides a method of synchronization in a pipelined computer having a first instruction pipeline and a second instruction pipeline, the first instruction pipeline having "n" stages, the second instruction pipeline having "m" stages, the method comprising the steps of feeding an instruction to the first instruction pipeline and the second instruction pipeline at a same time; advancing the instruction in the first instruction pipeline; advancing the instruction in the second instruction pipeline; and stopping advance off the instruction in a "j"-th stage of the second instruction pipeline until the instruction reaches an "i"-th stage of the first instruction pipeline to synchronize advance of the instruction in the first instruction pipeline and advance of the instruction in the second instruction pipeline at the "j"-th stage of the second instruction pipeline and the "i"-th stage of the first instruction pipeline, where "j" $\leq$ "m" and "i" $\leq$ "n"

A second aspect of this invention provides a method of disabling an instruction in a pipelined computer having a first instruction pipeline and a second instruction pipeline, the method comprising the steps of detecting an exception of an instruction processed in the first instruction pipeline; judging whether or not the detected exception requires an instruction processed in the second instruction pipeline to be disabled; and disabling the instruction in the second instruction pipeline in response to a result of said judging step.

A third aspect of this invention provides a method of synchronization in a pipelined computer having a first instruction pipeline, a second instruction pipeline, and a third instruction pipeline, the first instruction pipeline having "n" stages, the second instruction pipeline having "m" stages, the third instruction pipeline having "k" stages, the method comprising the steps of feeding an instruction to the first instruction pipeline, the second instruction pipeline, and the third instruction pipeline at a same time; advancing the instruction in the first instruction pipeline; advancing the instruction in the second instruction pipeline; advancing the instruction in the third instruction pipeline; stopping advance of the instruction in a "j"-th stage of the second instruction pipeline until the instruction reaches an "i"-th stage of the first instruction pipeline to synchronize advance of the instruction in the first instruction pipeline and advance of the instruction in the second instruction pipeline at the "j"-th stage of the second instruction pipeline and the "i"-th stage of the first instruction pipeline, where "j" $\leq$ "m" and "i" $\leq$ "n"; and stopping advance of the instruction in a "y"-th stage of the third instruction pipeline until the instruction reaches an "x"-th stage of the first instruction pipeline to synchronize advance of the instruction in the first instruction pipeline and advance of the instruction in the third instruction pipeline at the "y"-th stage of the third instruction pipeline and the "x"-th stage of the first instruction pipeline, where "y" $\leq$ "k" and "x" $\leq$ "n".

A fourth aspect of this invention provides a method of disabling an instruction in a pipelined computer having a first instruction pipeline, a second instruction pipeline, and a third instruction pipeline, the method comprising the steps of detecting an exception of an instruction processed in the first instruction pipeline; judging whether or not the detected exception requires an instruction processed in the second instruction pipeline to be disabled; disabling the instruction in the second instruction pipeline in response to a result of the judging step related to the second instruction pipeline; judging whether or not the detected exception requires an instruction processed in the third instruction pipeline to be disabled; and disabling the instruction in the third instruction pipeline in response to a result of the judging step related to the third instruction pipeline.

A fifth aspect of this invention provides a method of synchronization in a pipelined computer having a first instruction pipeline and a second instruction pipeline, the first instruction pipeline having "n" stages, the second instruction pipeline having "m" stages, the method comprising the steps off feeding an instruction to the first instruction pipeline and the second instruction pipeline at a same time; advancing the instruction in the first instruction pipeline; advancing the instruction in the second instruction pipeline; either stopping advance of the instruction in a "j"-th stage of the second instruction pipeline until the instruction reaches an "i"-th stage of the first instruction pipeline to synchronize advance of the instruction in the first instruction pipeline and advance of the instruction in the second instruction pipeline at the "j"-th stake of the second instruction pipeline and the "i"-th stage of the first instruction pipeline, where "j"≦"m" and "i"≦"n"; or stopping advance of the instruction in a "p"-th stake of the first instruction pipeline until the instruction reaches a "q"-th stage of the second instruction pipeline to synchronize advance of the instruction in the second instruction pipeline and advance of the instruction in the first instruction pipeline at the "p"-th stage of the first instruction pipeline and the "q"-th stage of the second instruction pipeline, where "p"≦"n" and "q"≦"m".

A sixth aspect of this invention provides a method of disabling an instruction in a pipelined computer having a first instruction pipeline and a second instruction pipeline, the method comprising the steps of either detecting an exception of an instruction processed in the first instruction pipeline; judging whether or not the detected exception of the instruction in the first instruction pipeline requires an instruction processed in the second instruction pipeline to be disabled; and disabling the instruction in the second instruction pipeline in response to a result of said judging step related to the second instruction pipeline; or detecting an exception of an instruction processed in the second instruction pipeline; judging whether or not the detected exception of the instruction in the second instruction pipeline requires an instruction processed in the first instruction pipeline to be disabled; and disabling the instruction in the first instruction pipeline in response to a result of said judging step related to the first instruction pipeline.

A seventh aspect of this invention provides a pipelined computer comprising a first instruction pipeline having a plurality of stages; a second instruction pipeline having a plurality of stages; a first instruction pipeline controller controlling the first instruction pipeline; a second instruction pipeline controller controlling the second instruction pipeline; a condition holding device including condition temporarily-holding devices provided in the stages of the second instruction pipeline respectively, and a condition generator generating a condition of the first instruction pipeline each time the first instruction pipeline advances; and means for monitoring the advance of the first instruction pipeline via the condition holding device, and for controlling advance of the second instruction pipeline in response to the monitored advance of the first instruction pipeline.

An eighth aspect of this invention provides a pipelined computer comprising a first instruction pipeline having a plurality of stages; a second instruction pipeline having a plurality of stages; a first instruction pipeline controller controlling the first instruction pipeline; a second instruction pipeline controller controlling the second instruction pipeline; a condition holding device including condition temporarily-holding devices provided in the stages of the second instruction pipeline respectively, and a condition generator generating a condition of the first instruction pipeline each time the first instruction pipeline advances; an exception detector detecting an exception of an instruction processed in the first instruction pipeline; a judgment section judging whether or not an instruction processed in the second instruction pipeline to be disabled on the basis of the detected exception and a value of at least one of the condition temporarily-holding devices; and means for disabling the instruction in the second instruction pipeline in response to a result of said judging by the judgment section.

A ninth aspect of this invention provides a pipelined computer comprising a first instruction pipeline having a plurality of stages; a second instruction pipeline having a plurality of stages; a third instruction pipeline having a plurality of stages; a first instruction pipeline controller controlling the first instruction pipeline; a second instruction pipeline controller controlling the second instruction pipeline; a third instruction pipeline controller controlling the third instruction pipeline; a first condition holding device including condition temporarily-holding devices provided in the stages of the second instruction pipeline respectively, and a condition generator generating a condition of the first instruction pipeline each time the first instruction pipeline advances; a second condition holding device including condition temporarily-holding devices provided in the stages of the third instruction pipeline respectively, and a condition generator generating a condition of the first instruction pipeline each time the first instruction pipeline advances; means for monitoring the advance of the first instruction pipeline via the first condition holding device, and for controlling advance of the second instruction pipeline in response to the monitored advance of the first instruction pipeline; and means for monitoring the advance of the first instruction pipeline via the second condition holding device, and for controlling advance of the third instruction pipeline in response to the monitored advance of the first instruction pipeline.

A tenth aspect of this invention provides a pipelined computer comprising a first instruction pipeline having a plurality of stages; a second instruction pipeline having a plurality of stages; a third instruction pipeline having a plurality of stages; a first instruction pipeline controller controlling the first instruction pipeline; a second instruction pipeline controller controlling the second instruction pipeline; a third instruction pipeline controller controlling the third instruction pipeline; a first condition holding device including condition temporarily-holding devices provided in the stages of the second instruction pipeline respectively, and a condition generator generating a condition of the first instruction pipeline each time the first instruction pipeline advances; a second condition holding device including condition temporarily-holding devices provided in the stages of the third instruction pipeline respectively, and a condition generator generating a condition of the first instruction pipeline each time tile first instruction pipeline advances; an exception detector detecting an exception of an instruction processed in the first instruction pipeline; a first judgment section judging whether or not an instruction processed in the second instruction pipeline be disabled on the basis of the detected exception and a value of at least one of the condition temporarily-holding devices in the first condition holding device; means for disabling the instruction in the second instruction pipeline in response to a result of said judging by the first judgment section; a second judgment section judging whether or not an instruction processed in the third instruction pipeline to be disabled on the basis of the detected exception and a value of at least one of the condition temporarily-holding devices in the second condition holding device; and means for disabling the instruction in the third instruction pipeline in response to a result of said judging by the second judgment section.

An eleventh aspect of this invention, a pipelined computer comprising a first instruction pipeline having a plurality of stages; a second instruction pipeline having a plurality of stages; a first instruction pipeline controller controlling the first instruction pipeline; a second instruction pipeline controller controlling the second instruction pipeline; a first condition holding device including condition temporarily-holding devices provided in the stages of the first instruction pipeline respectively, and a condition generator generating a condition each time the second instruction pipeline advances; and a second condition holding device including condition temporarily-holding devices provided in the stages of the second instruction pipeline respectively, and a condition generator generating a condition each time the first instruction pipeline advances; either means for monitoring the advance of the first instruction pipeline via the second condition holding device, and for controlling advance of the second instruction pipeline in response to the monitored advance of the first instruction pipeline; or means for monitoring the advance of the second instruction pipeline via the first condition holding device, and for controlling advance of the first instruction pipeline in response to the monitored advance of the second instruction pipeline.

A twelfth aspect of this invention provides a pipelined computer comprising a first instruction pipeline having a plurality of stages; a second instruction pipeline having a plurality of stages; a first instruction pipeline controller controlling the first instruction pipeline; a second instruction pipeline controller controlling the second instruction pipeline; a first condition holding device including condition temporarily-holding devices provided in the stages of the first instruction pipeline respectively, and a condition generator generating a condition each time the second instruction pipeline advances; a second condition holding device including condition temporarily-holding devices provided in the stages of the second instruction pipeline respectively, and a condition generator generating a condition each time the first instruction pipeline advances; a first exception detector detecting an exception of an instruction processed in the first instruction pipeline; and a second exception detector detecting an exception of an instruction processed in the second instruction pipeline; either a first judgment section judging whether or not an instruction processed in the first instruction pipeline to be disabled on the basis of the exception detected by the second exception detector and a value of at least one of the condition temporarily-holding devices in the first condition holding device; and means for disabling the instruction in the first instruction pipeline in response to a result of said judging by the first judgment section; or a second judgment section judging whether or not an instruction processed in the second instruction pipeline to be disabled on the basis of the exception detected by the first exception detector and a value of at least one of the condition temporarily-holding devices in the second condition holding device; and means for disabling the instruction in the second instruction pipeline in response to a result of said judging by the second judgment section.

A thirteenth aspect of this invention provides a pipelined computer comprising first and second instruction pipelines; means for feeding an instruction to the first and second pipelines at a same time; means for advancing the instruction in the first pipeline; means for advancing the instruction in the second pipeline; means for detecting a position of the instruction in the first pipeline; and means for controlling advance of the instruction in the second pipeline in accordance with the detected position of the instruction in the first pipeline to synchronize advance of the instruction in the first pipeline and advance of the instruction in the second pipeline.

A fourteenth aspect of this invention provides a pipelined computer comprising first and second instruction pipelines; means for feeding instructions to the first and second pipelines; means for advancing the instructions in the first pipeline; means for advancing the instructions in the second pipeline; means for detecting an exception of at least one of the instructions in the first pipeline; and means for disabling at least one of the instructions in the second pipeline in response to the detected exception.

BRIEF DESCRIPTION OF THE DRAWINGS

FIG. 6 is a diagram showing the relation between the second pipeline control signal and the conditions of the second instruction pipeline in the pipelined computer of FIG. 2.

FIGS. 7, 8 and 9 are block diagrams of the logic circuits and the selectors in the second instruction pipeline of the pipelined computer of FIG. 2.

DESCRIPTION OF THE FIRST PREFERRED EMBODIMENT

Figure 1:
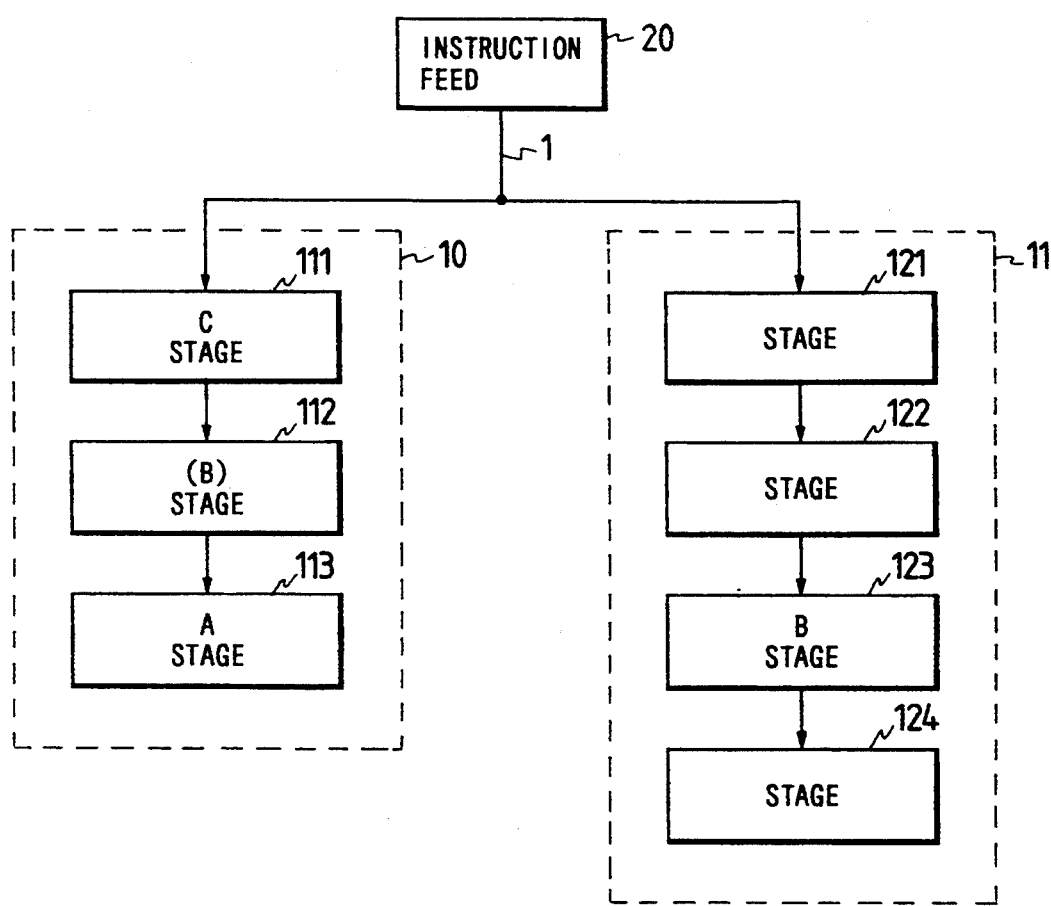
FIG. 1 is a diagram of a pipelined computer according to a first embodiment of this invention.

With reference to FIG. 1, a pipelined computer includes first and second instruction pipelines 10 and 11. The first instruction pipeline 10 has first, second, and third stages 111, 112, and 113. The second instruction pipeline 11 has first, second, third, and fourth stages 121, 122, 123, and 124. An instruction feed section 20 feeds an instruction 1 to the instruction pipelines 10 and 11 at the same time.

The operation will be explained hereinafter in the case where instructions A, B, and C are sequentially fed and the instructions A and C are executed by the first instruction pipeline 10 while the instruction B is executed by the second instruction pipeline 11. Firstly, the instruction A is fed to tile instruction pipelines 10 and 11. The first instruction pipeline 10 executes the instruction A. It is unnecessary for the second instruction pipeline 11 to execute the instruction A, so that the second instruction pipeline 11 disables the instruction A. Then, the instruction B is fed to the instruction pipelines 10 and 11. The instruction B is inputted into the second instruction pipeline 11. The instruction B is also inputted into the first instruction pipeline 10, and the instruction B occupies the stage of the first instruction pipeline 10 which follows the stage occupied by the preceding instruction A.

Although it is unnecessary that tile instruction B is executed by the first instruction pipeline 10, the instruction B occupies one of the stages of the first instruction pipeline 10 in this way so that the sequence between the instructions A and B and the sequence between the instructions B and C will be recorded. The process is necessary for the following reasons. In the case where the execution of an instruction needs to be interrupted upon the occurrence of an exception, the contents of registers in a computer which occur at respective moments are required to be updated in the same sequence as the sequence of the execution of instructions. Thus, the contents of a register related to the instruction B within the second instruction pipeline 11 can not be updated before the preceding instruction A is completed normally (without causing an exception) in the first instruction pipeline 10. The movement of instruction B in the first instruction pipeline 10 is followed to detect the movement of the preceding instruction, and the advance of the instruction B in the second instruction pipeline 11 is controlled on the basis of a result of the detection. Furthermore, in the case of the occurrence of an exception (an abnormality) in the instruction B or the preceding instruction in the first instruction pipeline 10, the execution of the instruction B in the second instruction pipeline 11 is disabled to prevent the contents of the related register from being updated by the instruction B.

DESCRIPTION OF THE SECOND PREFERRED EMBODIMENT

Figure 2:
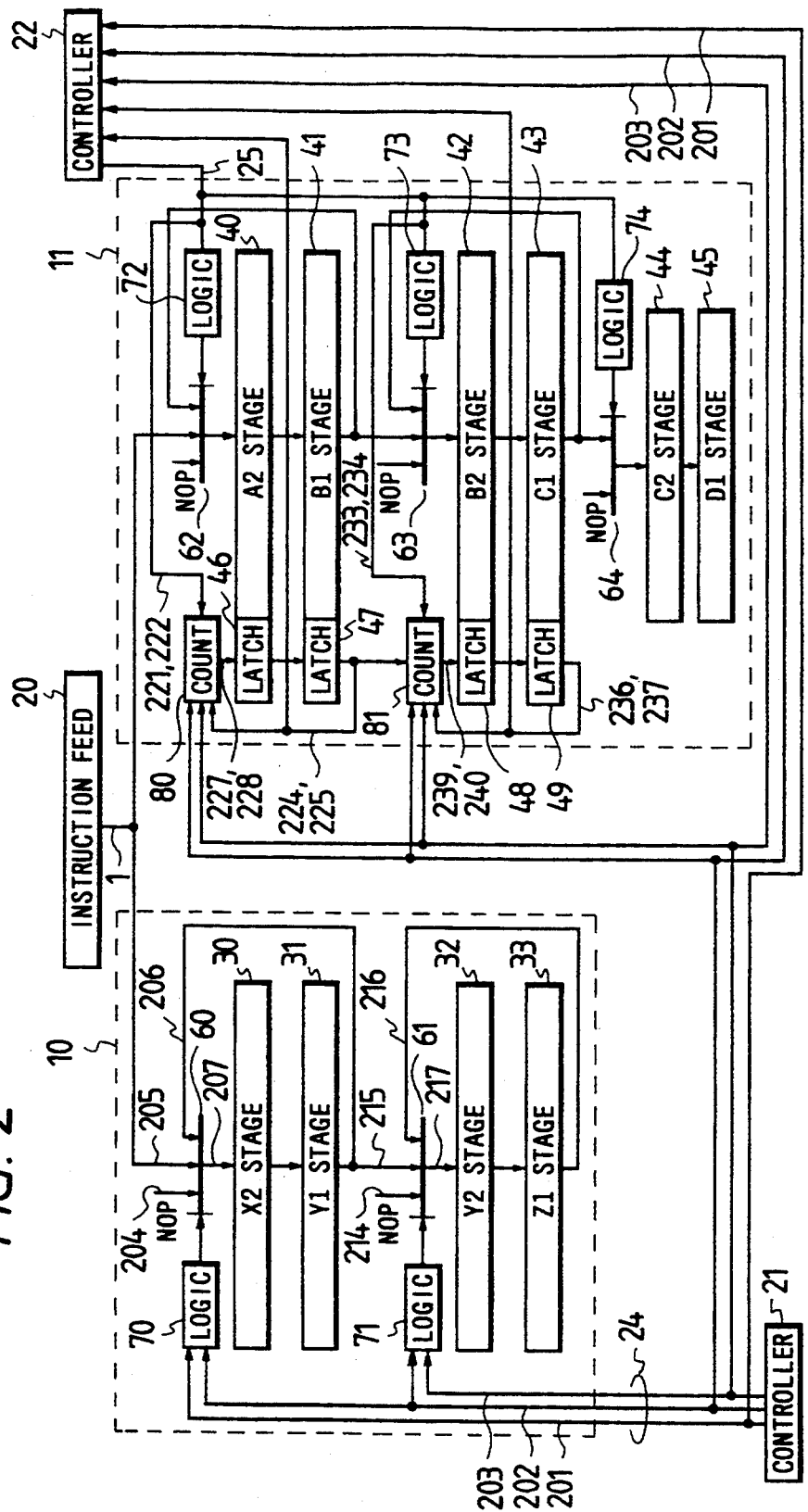
FIG. 2 is a block diagram of a pipelined computer according to a second embodiment of this invention.

With reference to FIG. 2, a pipelined computer includes a 2-stage first instruction pipeline 10 and a 3-stage second instruction pipeline 11. The first instruction pipeline 10 has a first stage composed of an X2 sub stage 30 and a Y1 sub stage 31, and a second stage composed of a Y2 sub stage 32 and a Z1 sub stage 33. The second instruction pipeline 11 has a first stage composed of an A2 sub stage 40 and a B1 sub stage 41, a second stage composed of a B2 sub stage 42 and a C1 sub stage 43, and a third stage composed of a C2 sub stage 44 and a D1 sub stage 45. Each of the stages in the instruction pipelines 10 and 11 are driven by bi-phase clock signals ph1 and ph2 generated by suitable clock generators (not shown). The Y1 stage 31 and the Z1 stage 33 of the first pipeline 10, and the B1 stage 41, the C1 stage 43, and the D1 stage 45 of the second pipeline 11 are formed by latches driven by the clock signal phi.. The other stages are formed by latches driven by the clock signal ph2. The instruction pipelines 10 and 11 are simultaneously fed with an instruction 1 from an instruction feed section 20. The advances of the instruction 1 in the instruction pipelines 10 and 11 are controlled by pipeline controllers 21 and 22 respectively.

The first instruction pipeline controller 21 generates a control signal 24 (TOX 201, TOY 202, and TOZ 203). Logic circuits 70 and 71 generate selector control signals on the basis of the control signal 24 fed from the controller 21. An input selector 60 for the first stage 30 is controlled by the selector control signal fed from the logic circuit 70. An input selector 61 for the third stage 32 is controlled by the selector control signal fed from the logic circuit 71. The advance of instructions in the First instruction pipeline 10 is performed by the control of the input selectors 60 and 61.

FIG. 3 shows the relation between the control signal 24 fed to the first instruction pipeline 10 and the positional conditions of the instructions in the first instruction pipeline 10. It is now assumed that, in an original condition, the instruction C is present in the instruction feed section 20 being the first stage and the instruction B is present in the X2 stage 30 and the Y1 stage 31 being the second stage while the instruction A is present in the Y2 stage 32 and the Z1 stage 33 being the third stage. The first pipeline control signal 24 (TOX 201, TOY 202, and TOZ 203) will be expressed as (TOX, TOY, TOZ) hereinafter.

(1) In the case where the control signal 24 is (1, 1, 1), the instructions are advanced by distances corresponding to two sub stages and a new instruction D is present in the instruction feed section 20.

(2) In the case where the control signal 24 is (0, 1, 1), the instruction C remains stationary in the instruction feed section 20 and the instruction B advances to the Y2 stage 32 and the Z1 stage 33. In this case, an instruction corresponding to NOP (no operation) is fed to the X2 stage 30 and the Y1 stage 31.

(3) In the case where the control signal 24 is (0, 0, 1), the instruction C remains stationary in the instruction feed section 20, and the instruction B remains stationary in the X2 stage 30 and the Y1 stage 31 but only the instruction A advances. In this case, an instruction corresponding to NOP is fed to the Y2 stage 32 and the Z1 stage 33.

(4) In the case where the control signal 24 is (0, 0, 0), all the instructions remain stationary so that the original condition continues.

Figure 4:
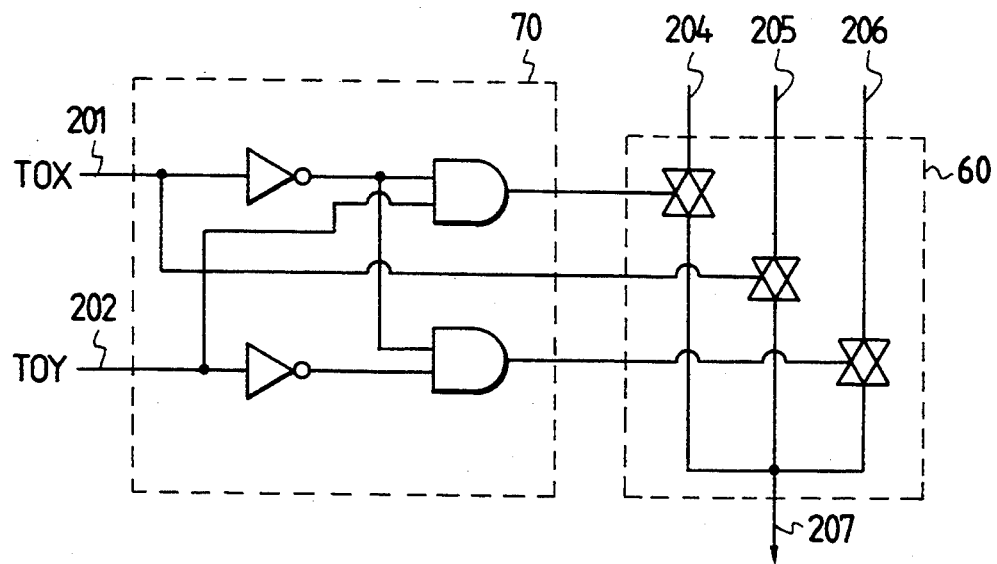
FIGS. 4 and 5 are block diagrams of the logic circuits and the selectors in the first instruction pipeline of the pipelined computer of FIG. 2.

As shown in FIG. 4, the input selector 60 includes switches controlled by output signals from the logic circuit 70. The logic circuit 70 includes a combination of inverters and AND gates. The logic circuit 70 receives the TOX 201 and the TOY 202 of the control signal 24, and generates switch control signals on the basis of the TOX 201 and the TOY 202. The switch control signals are fed from the logic circuit 70 to the switches of the input selector 60. The switches off the input selector 60 control the selection and the transmission of an instruction 204 corresponding to NOP, an instruction 205 from the instruction feed section 20, and a feedback instruction 206 from the Y1 stage 31 in accordance with the switch control signals. The instruction 207 selected by the input selector 60 is transmitted to the X2 stage 30.

Figure 5:
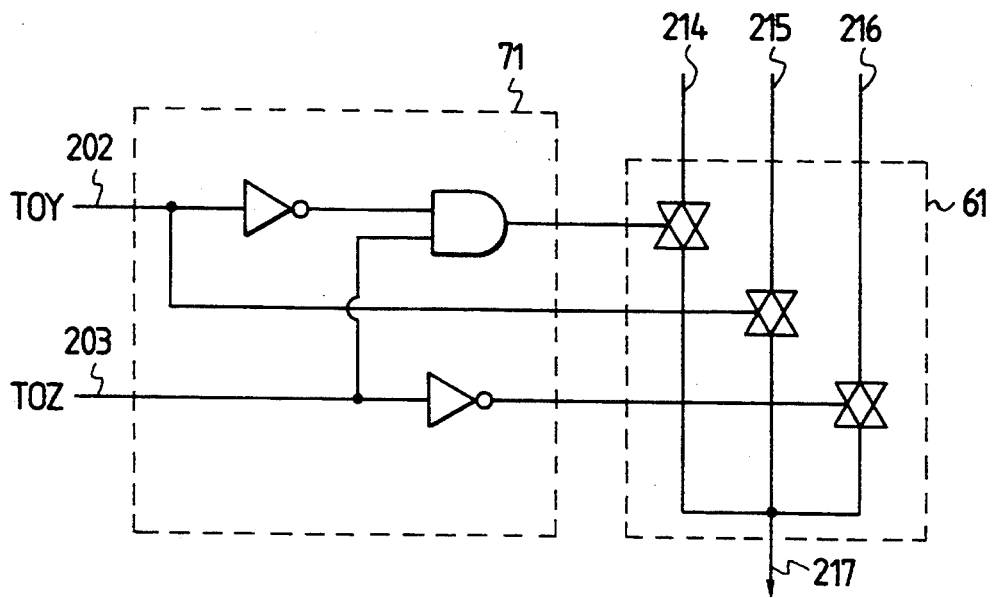

As shown in FIG. 5, the input selector 61 includes switches controlled by output signals from the logic circuit 71. The logic circuit 71 includes a combination of inverters and an AND gate. The logic circuit 71 receives the TOY 202 and the TOZ 203 of the control signal 24, and generates switch control signals on the basis of the TOY 202 and the TOZ 203. The switch control signals are fed from the logic circuit 71 to the switches of the input selector 61. The switches off the input selector 61 control the selection and the transmission of an instruction 214 corresponding to NOP, an instruction 215 from the Y1 stage 31, and a feedback instruction 216 from the Z1 stage 33 in accordance with the switch control signals. The instruction 217 selected by the input selector 61 is transmitted to the Y2 stage 32.

The second instruction pipeline controller 22 generates a control signal 25 (A1SEL, B1SEL, and C1SEL). Logic circuits 72, 73, and 74 generate selector control signals on the basis of the control signal 25 fed from the controller 22. An input selector 62 for the A2 stage 40 is controlled by the selector control signal fed from the logic circuit 72. An input selector 63 for the B2 stage 42 is controlled by the selector control signal fed from the logic circuit 73. An input selector 64 for the C2 stage 44 is controlled by the selector control signal fed from the logic circuit 74. The advance of instructions in the second instruction pipeline 11 is performed by the control of the input selectors 62-64.

FIG. 6 shows the relation between the control signal 25 fed to the second instruction pipeline 11 and the positional conditions of the instructions in the second instruction pipeline 11. The second instruction pipeline control signal 25 is composed of three signals, that is, A1SEL, B1SEL, and C1SEL. The advance of instructions in the second pipeline 11 is controlled in dependence upon the values of the signals A1SEL, B1SEL, and C1SEL. The signals A1SEL and B1SEL are represented by two signal lines. It is now assumed that, in an original condition, the instruction D is present in the instruction feed section 20 being the first stage and the instruction C is present in the A2 stage 40 and the B1 stage 41 being the second stage while the instruction B is present in the B2 stage 42 and the C1 stage 43 being the third stage and the instruction A is present in the C2 stage 44 and the D1 stage 45 being the fourth stage. The second pipeline control signal 25 will be expressed as (A1SEL, B1SEL, C1SEL) hereinafter.

(1) In the case where the control signal 25 is (1, 1, 1), the instructions are advanced by distances corresponding to two sub stages and a new instruction E is present in the instruction feed section 20.

(2) In the case where the control signal 25 is (0, 1, 1), the instruction D remains stationary in the instruction feed section 20, and the instruction C advances to the B2 stage 42 and the C1 stage 43 while the instruction B advances to the C2 stage 44 and the D1 stage 45. In this case, an instruction corresponding to NOP is fed to the A2 stage 40 and the B1 stage 41.

(3) In the case where the control signal 25 is (2, 0, 1), the instruction D remains stationary in the instruction feed section 20, and the instruction C remains stationary in the A2 stage 40 and the B1 stage 41 but the instruction B advances to the C2 stage 44 and the D1 stage 45. In this case, an instruction corresponding to NOP is fed to the B2 stage 42 and the C1 stage 43.

(4) In the case where the control signal 25 is (2, 2, 0), the instructions D, C, and B remain stationary but the instruction A moves out off the second pipeline 11. In this case, an instruction corresponding to NOP is fed to the C2 stage 44 and the D1 stage 45.

Figure 7:
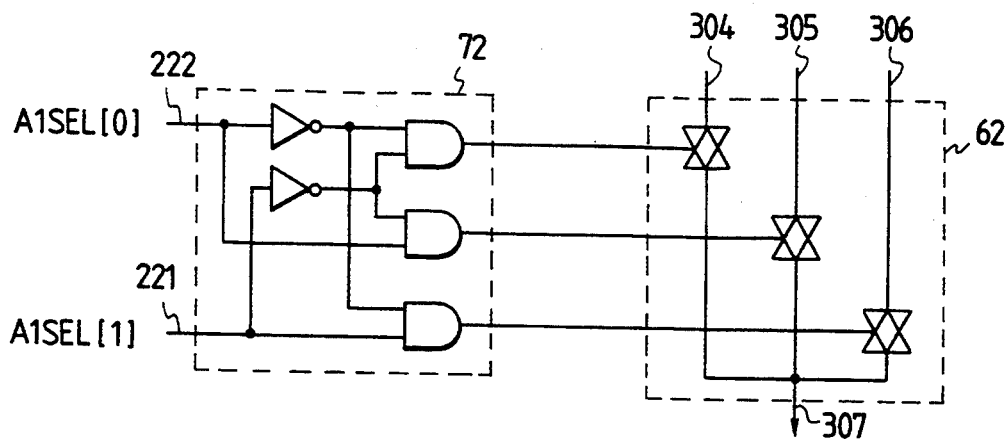

As shown in FIG. 7, the input selector 62 includes switches controlled by output signals from the logic circuit 72. The logic circuit 72 includes a combination of inverters and AND gates. The logic circuit 72 receives the A1SEL[0] 222 and the A1SEL[1] 221 of the control signal 25, and generates switch control signals on the basis of the A1SEL[0] 222 and the A1SEL[1] 221. The switch control signals are fed from the logic circuit 72 to the switches of the input selector 62. The switches of the input selector 62 control the selection and the transmission of an instruction 304 corresponding to NOP, an instruction 305 from the instruction feed section 20, and a feedback instruction 306 from the B1 stage 41 in accordance with the switch control signals. The instruction 307 selected by the input selector 62 is transmitted to the A2 stage 40.

Figure 8:
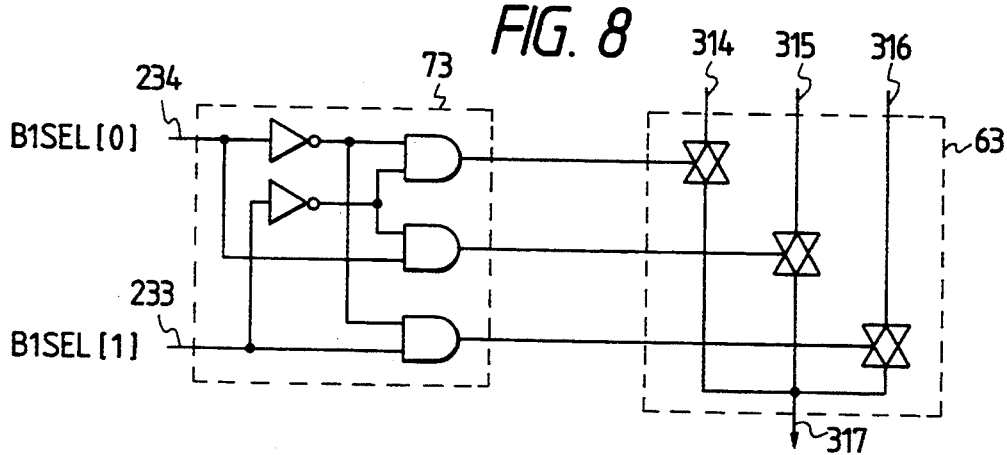
FIG. 8 is a diagram showing the relation between the first pipeline control signal and the conditions of the first instruction pipeline in the pipelined computer of FIG. 2.

As shown in FIG. 8, the input selector 63 includes switches controlled by output signals from the logic circuit 73. The logic circuit 73 includes a combination of inverters and AND gates. The logic circuit 73 receives the B1SEL[0] 234 and the B1SEL[1] 233 of the control signal 25, and generates switch control signals on the basis of the B1SEL[0] 234 and the B1SEL[1] 233.

The switch control signals are fed from the logic circuit 73 to the switches of the input selector 63. The switches of the input selector 63 control the selection and the transmission of an instruction 314 corresponding to NOP, an instruction 315 from the B1 stage 41, and a feedback instruction 316 from the C1 stage 43 in accordance with the switch control signals. The instruction 317 selected by the input selector 63 is transmitted to the B2 stage 42.

Figure 9:
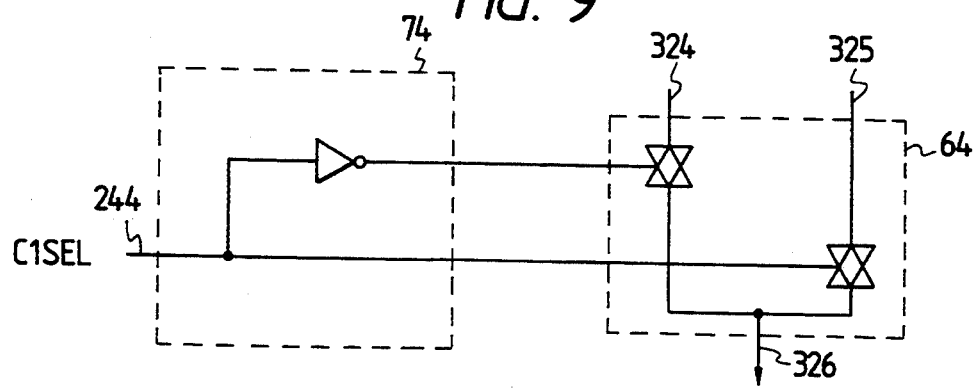

As shown in FIG. 9, the input selector 64 includes switches controlled by output signals from the logic circuit 74. The logic circuit 74 includes an inverter. The logic circuit 74 receives the C1SEL 244 of the control signal 25, and generates switch control signals on the basis of the C1SEL, 244. The switch control signals are fed from the logic circuit 74 to the switches of the input selector 64. The switches of the input selector 64 control the selection and the transmission of an instruction 324 corresponding to NOP and an instruction 325 from the C1 stage 43 in accordance with the switch control signals. The instruction 826 selected by the input selector 64 is transmitted to the C2 stage 44.

As shown in FIG. 2, the second instruction pipeline 11 includes counter circuits 80 and 81. The A2 stage 40, the B1 stage 41, the B2 stage 42, and the C1 stage 43 of the second instruction pipeline 11 are provided with 2-bit latches 46, 47, 48, and 49 serving as counting means respectively.

Figure 10:
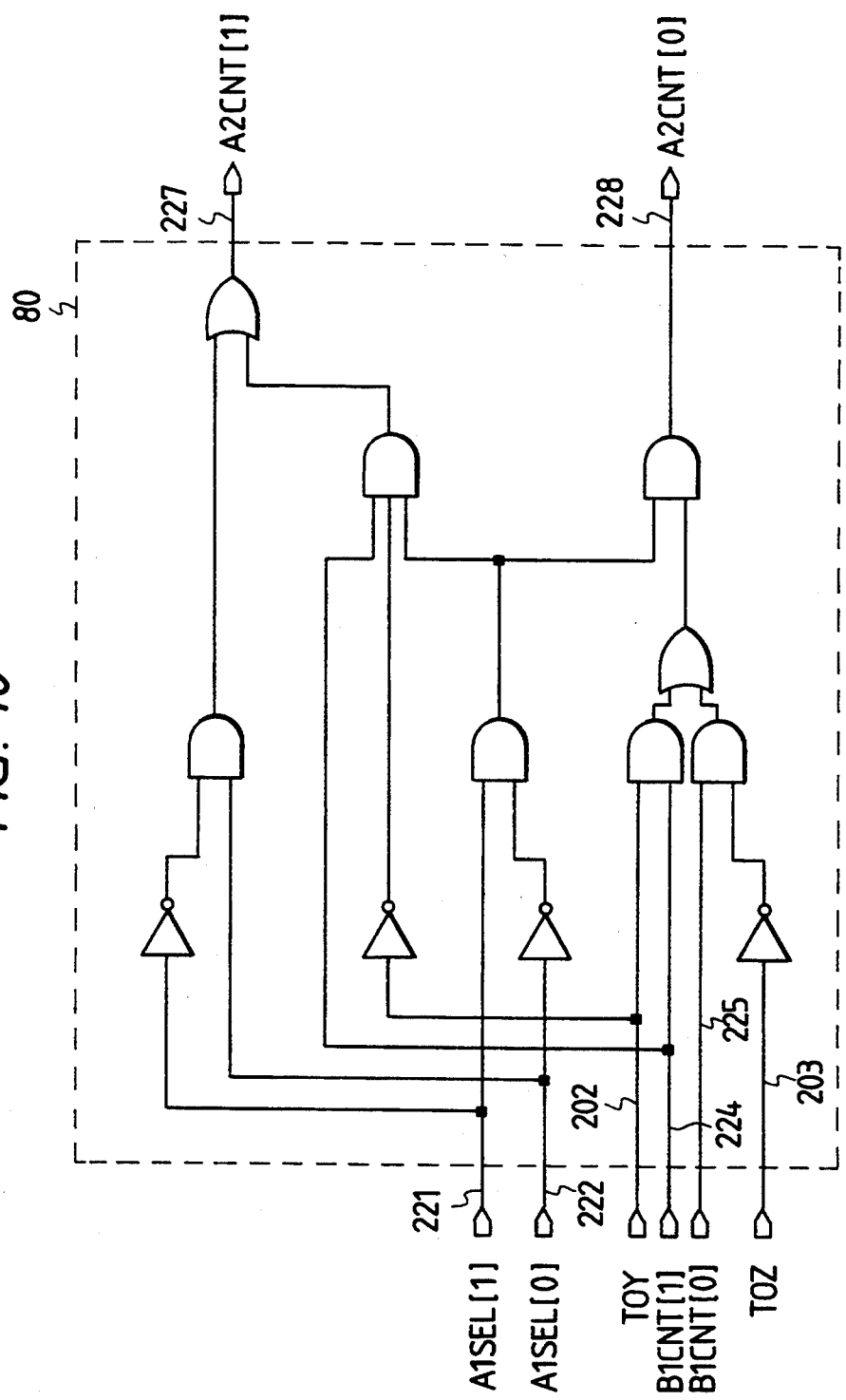
FIGS. 10 and 11 are block diagrams of the counter circuits in the pipelined computer of FIG. 2.

As shown in FIG. 10, the counter circuit 80 includes a combination of inverters, AND gates, and OR gates. The counter circuit 80 receives the TOY 202 and the TOZ 203 of the First instruction pipeline control signal 24, the A1SEL[1] 221 and the A1SEL[0] 222 of the second instruction pipeline control signal 25, and a B1CNT[1] 224 and a B1CNT[0] 225 being the values in the counter latch 47 of the B1 stage 41. The counter circuit 80 determines values A2CNT[1] 227 and A2CNT[0] 228 for the counter latch 46 of the A2 stage 40 on the basis of the received signals. Specifically, the counter circuit 80 functions to decrement the values in the counter latches in the respective stages in accordance with the movement of the instructions in the first instruction pipeline 10.

Figure 11:
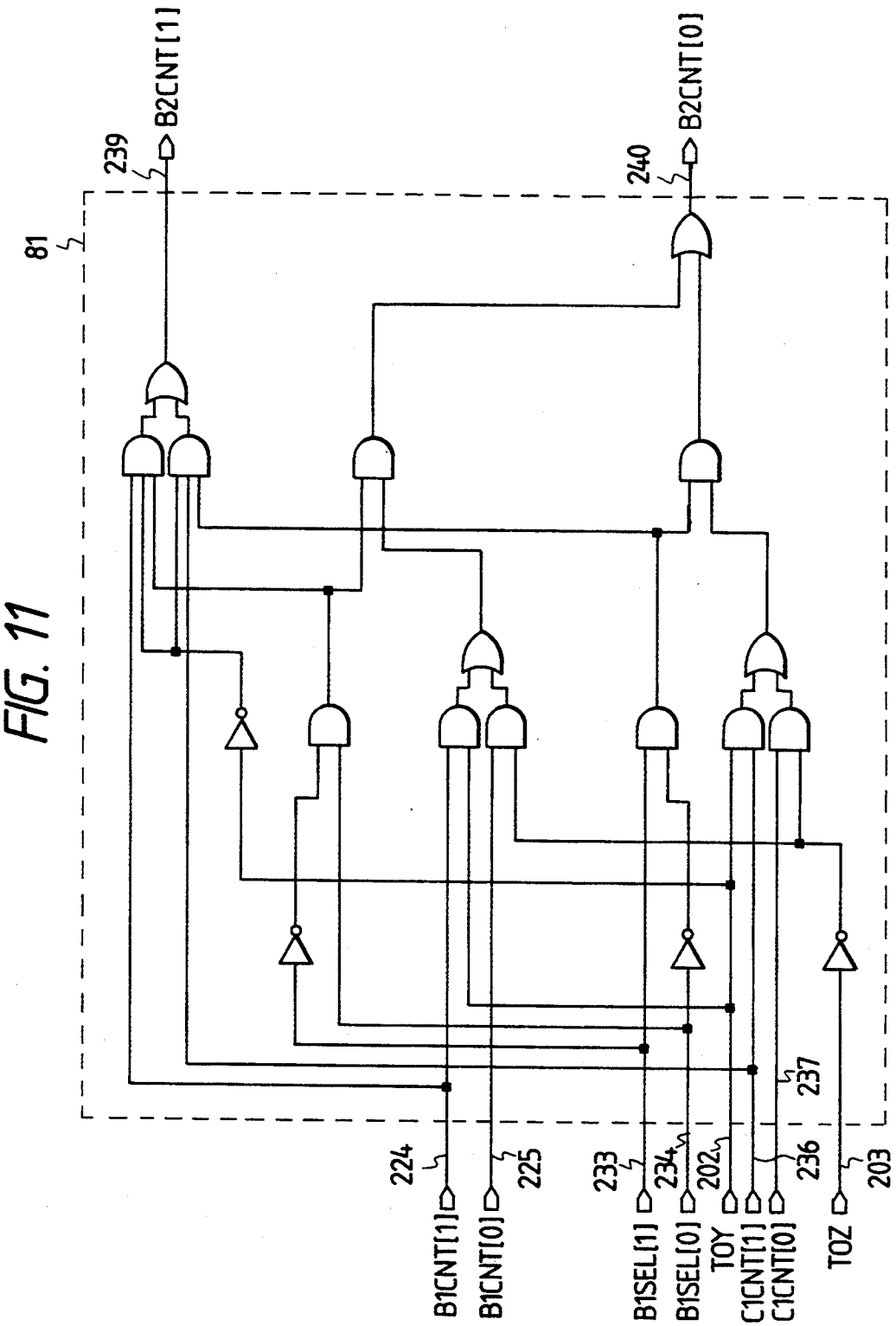

As shown in FIG. 11, the counter circuit 81 includes a combination of inverters, AND gates, and OR gates. The counter circuit 81 receives the TOY 202 and the TOZ 203 of the first instruction pipeline control signal 24, the B1SEL[1] 233 and the IR1SEL[0] 234 of the second instruction pipeline control signal 25, the B1CNT[1] 224 and the B1CNT[0] 225 being the values in the counter latch 47 of the B1 stage 41, and a C1CNT[1] 236 and a C1CNT[0] 237 being the values in the counter latch 49 of the C1 stage 43. The counter circuit 81 determines values B2CNT[1] 239 and B2CNT[0] 240 for the counter latch 48 of the B2 stage 42 on the basis of the received signals. Specifically, the counter circuit 81 functions to decrement the values in the counter latches in the respective stages in accordance with the movement of the instructions in the first instruction pipeline 10.

The value in the counter latch 46 of the A2 stage 40 is inputted into the counter latch 47 of the B1 stage 41 as it is. In addition, the value in the counter latch 48 of the B2 stage 42 is inputted into the counter latch 49 of the C1 stage 43 as it is.

Figure 12:
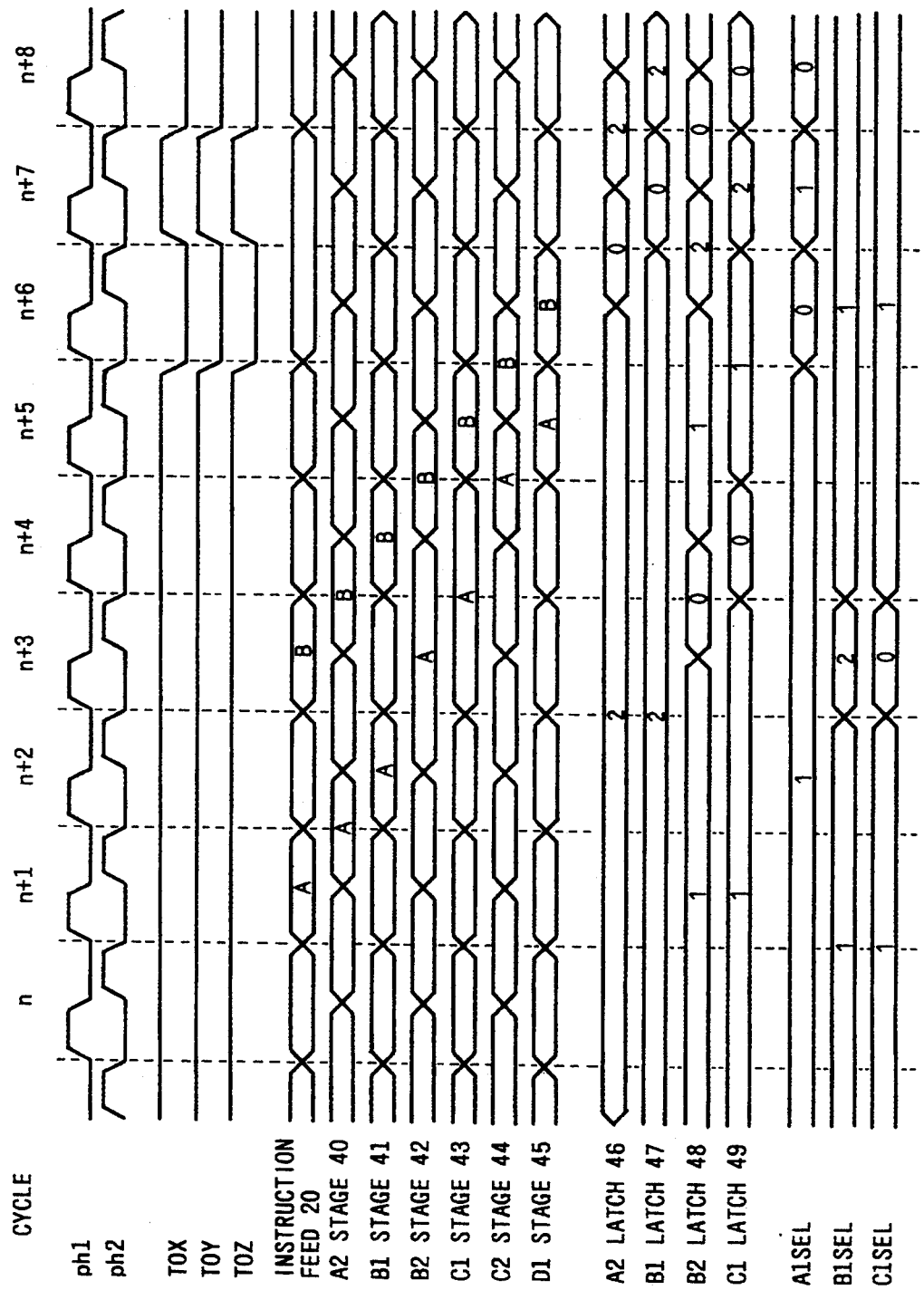
FIG. 12 is a timing diagram showing conditions of various portions and various signals in the pipelined computer of FIG. 2.
Figure 13:
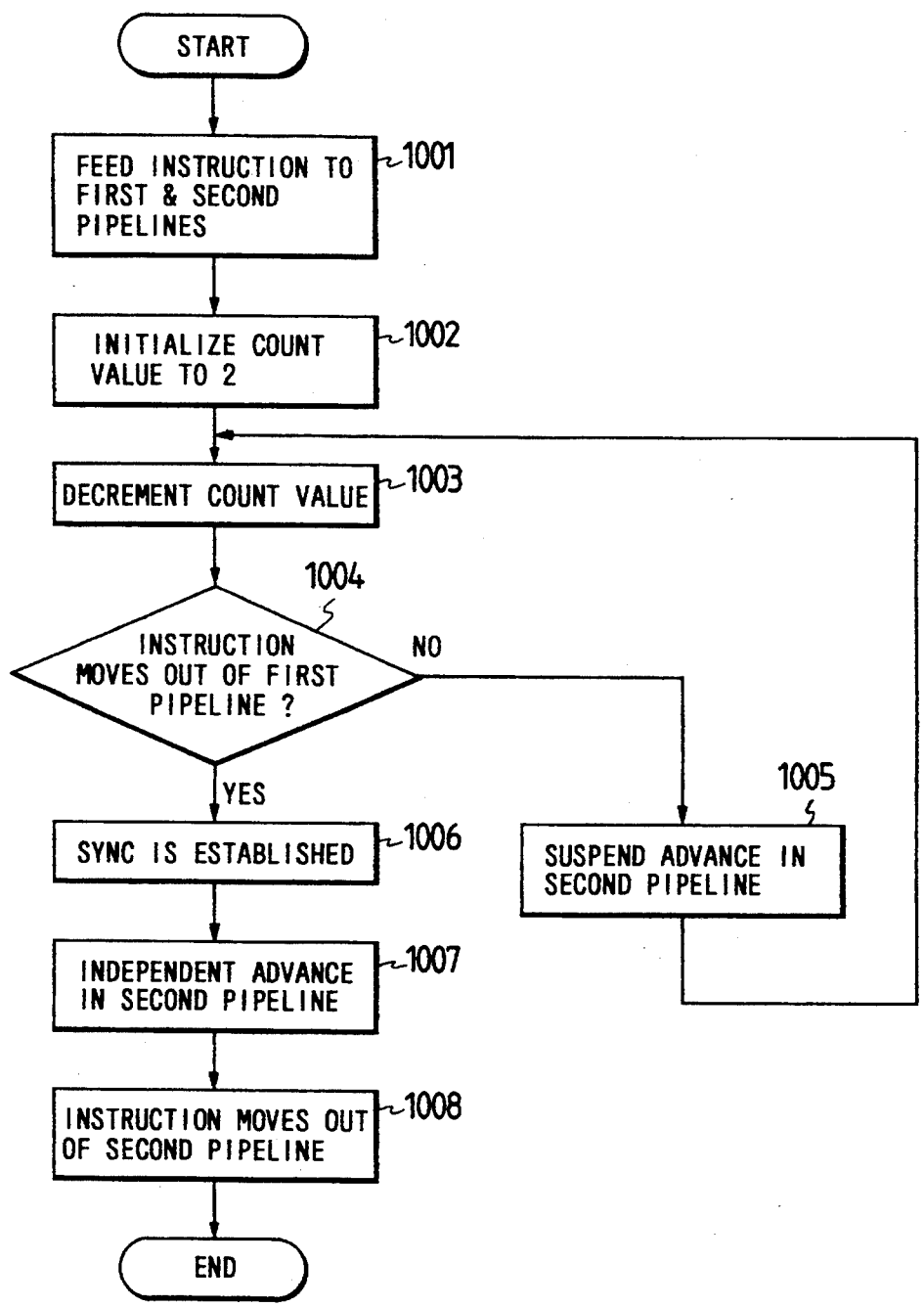
FIG. 13 is a flowchart of a synchronizing process in the pipelined computer of FIG. 2.

With reference to FIGS. 12 and 13, the operation of the pipelined computer will be described in the absence of an interruption of the instruction advance in the instruction pipelines for the maintenance of the synchronization.

As shown in FIG. 12, the clock signals ph1 and ph2 are in a bi-phase relation. It is now assumed that an instruction A to be processed by tile second instruction pipeline 11 appears in the instruction feed section 20 at the (n+1)-th cycle. During the (n+1)-th cycle, since all the components TOX, TOY, and TOZ of the first instruction pipeline control signal 24 are "1", the instruction A moves from the instruction feed section 20 into the first instruction pipeline 10 by a distance corresponding to two sub stages. This process corresponds to a step 1001 of FIG. 13. The instruction A is fed to the second instruction pipeline 11 at the same time as the feed of the instruction A to the first instruction pipeline 10. The reason for the feed of the instruction A to the first instruction pipeline 10 is that the second instruction pipeline 11 is controlled while the advance in the first instruction pipeline 10 is monitored. At the latter half of the (n+1)-th cycle, the instruction A enters the X2 stage 30 of the first instruction pipeline 10 and the A2 stage 40 of the second instruction pipeline 11, and the value in the counter latch 46 of the A2 stage 40 is set to an initial value "2" by the counter circuit 80. This process corresponds to a step 1002 of FIG. 13.

The counter latch value "2" means that the related instruction A is present in the part of the first instruction pipeline 10 between the X2 stage 30 and the Y1 stage 31. The counter latch value "1" means that the related instruction A is present in the part of the first instruction pipeline 10 between the Y2 stage 32 and the Z1 stage 33. The counter latch value "0" means that the related instruction A is present outside the first instruction pipeline 10 and is thus absent from the first instruction pipeline 10. In this way, the value of the counter latch directly represents the position of the related instruction A in the first instruction pipeline 10.

During the first half of the (n+2)-th cycle, the instruction A is moved from the X2 stage 30 to the Y1 stage 31 in the first instruction pipeline 10 and the instruction A is moved from the A2 stage 40 to the B1 stage 41 in the second instruction pipeline 11. At this time, "2" being the value in the counter latch 46 of the A2 stage 40 is set in the counter latch 47 of the B1 stage 41 as it is. During the latter half of the (n+2)-th cycle, the instruction A is moved from the Y1 stage 31 to the Y2 stage 32 in the first instruction pipeline 10 and the instruction A is moved from the B1 stage 41 to the B2 stage 42 in the second instruction pipeline 11. At this time, the value in the counter latch 48 of the B2 stage 42 is determined by the counter circuit 81 and is set to "1". This process corresponds to a step 1003 of FIG. 13.

During the (n+3)-th cycle, the second instruction pipeline controller 22 stops the advance of the instruction A in the second instruction pipeline 11 so that the instruction A stays at the B2 stage 42 and the C1 stage 43. In this way, the independence of the operation of the second instruction pipeline 11 is maintained at all times except for a time during which the synchronization is required. During the (n+3)-th cycle, the instruction A is moved in the first instruction pipeline 10. At the latter half of the (n+3)-th cycle, the value in the counter latch 48 of the B2 stage 42 is determined by the counter circuit 81 and is set to "0". This process corresponds to a step 1004 of FIG. 13.

During subsequent cycles, since the instruction A is already outside the first instruction pipeline 10, it is unnecessary to establish the synchronization between the first instruction pipeline 10 and the second instruction pipeline 11. Accordingly, the instruction A is moved in the second instruction pipeline 11 independent of the operation of the first instruction pipeline 10. This process corresponds to steps 1006, 1007, and 1008 off FIG. 13.

During the (n+3)-th cycle, an instruction B to be processed by the second instruction pipeline 11 appears in the instruction feed section 20. During the later cycles, the instruction B is moved in the second instruction pipeline 11 independent of the advance of the instruction B in the first instruction pipeline 10.

Figure 14:
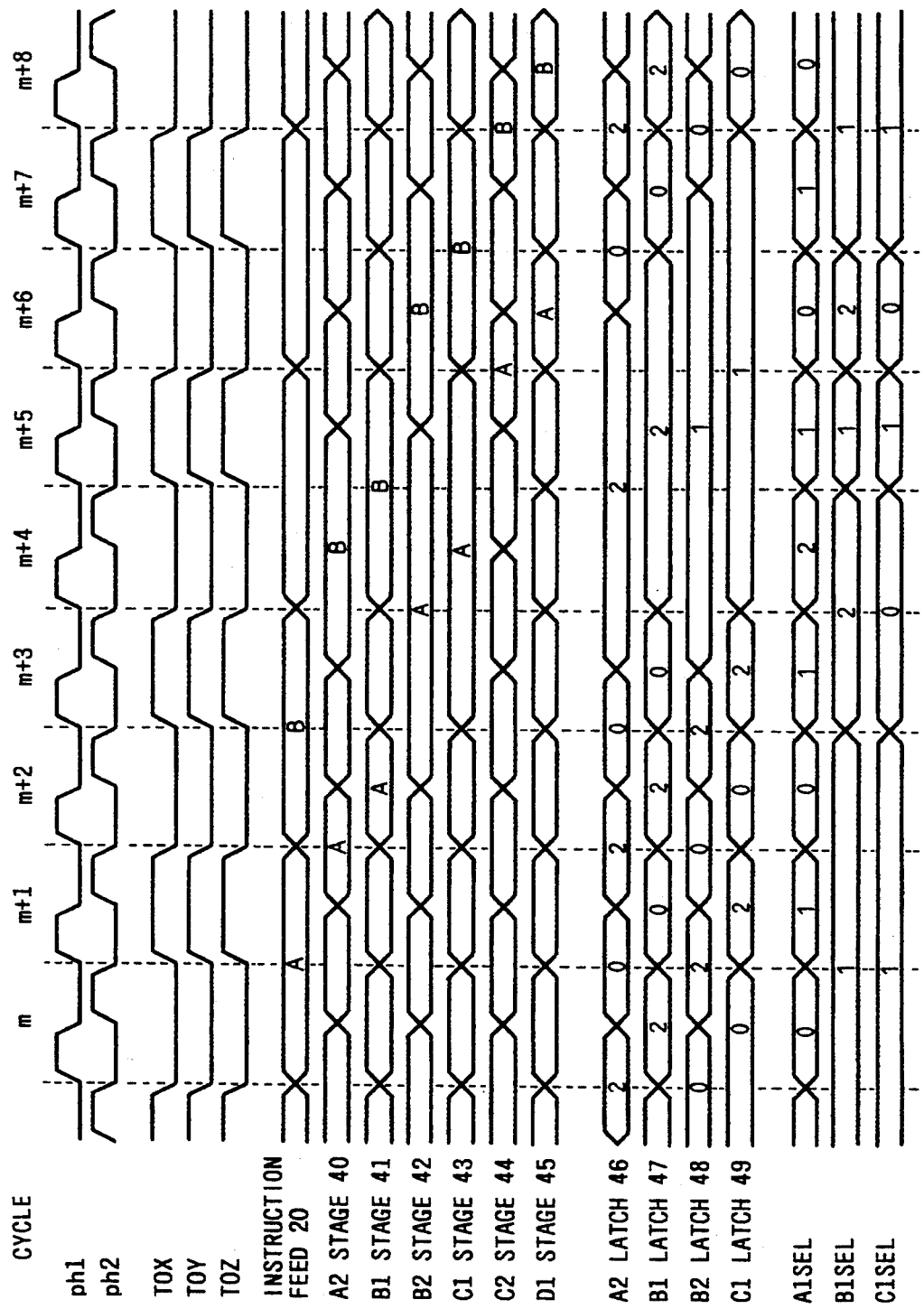
FIG. 14 is a timing diagram showing conditions of various portions and various signals in the pipelined computer of FIG. 2.

With reference to FIGS. 13 and 14, the operation of the pipelined computer will be described in the presence of an interruption of the instruction advance in the instruction pipelines for the maintenance of the synchronization.

As shown in FIG. 14, it is now assumed that an instruction A to be processed by the second instruction pipeline 11 appears in the instruction feed section 20 at the m-th cycle. During the m-th cycle, since all the components TOX, TOY, and TOZ of the first instruction pipeline control signal 24 are "0", the instruction A stays at the instruction feed section 20 and does not enter the instruction pipelines 10 and 11.

It is now assumed that all the components TOX, TOY, and TOZ of the first instruction pipeline control signal 24 become "1" at the (m+1)-th cycle (see the step 1001 of FIG. 13). During the latter half of the (m+1)-th cycle, the instruction A enters the X2 stage 30 of the first instruction pipeline 10 and the A2 stage 40 of the second instruction pipeline 11. At the same time, the value in the counter latch 46 of the A2 stage 40 is set to an initial value "2" by the counter circuit 80. This process corresponds to the step 1002 of FIG. 18. During the later cycles, the value in the counter latch 46 is decremented as the instruction A advances in the first instruction pipeline 10.

During the first half of the (m+2)-th cycle, the instruction A is moved from the X2 stage 30 to the Y1 stage 31 in the first instruction pipeline 10 and the instruction A is moved from the A2 stage 40 to the B1 stage 41 in the second instruction pipeline 11. At this time, "2" being the value in the counter latch 48 of the A2 stage 40 is set in the counter latch 47 of the B1 stage 41 as it is. During the (m+2)-th cycle, since all the components TOX, TOY, and TOZ of the first instruction pipeline control signal 24 are "0", the advance of the instruction A in the First instruction pipeline 10 is stopped. In addition, during the (m+2)-th cycle, an instruction B to be processed by the second instruction pipeline 11 appears in the instruction feed section 20, and the instruction B stays in the instruction feed section 20 since all the components TOX, TOY, and TOZ of the first instruction pipeline control signal 24 are "0". During the latter half of the (m+2)-th cycle, the instruction A is moved from the B1 stage 41 to the B2 stage 42 in the second instruction pipeline 11 independent of the advance of the instruction A in the first instruction pipeline 10. At this time, the value in the counter latch 48 of the B2 stage 42 is determined by the counter circuit 81. In this case, since the counting is suspended, "2" being the value in the counter latch 47 of tile B1 stage 41 is set in the counter latch 48 of the B2 stage 42.

During the (m+3)-th cycle, the second instruction pipeline controller 22 stops the advance of the instruction A in the second instruction pipeline 11 so that the instruction A stays at the B2 stage 42 and the C1 stage 43. In this way, the independence of the operation of the second instruction pipeline 11 is maintained at all times except for a time during which the synchronization is required. During the (m+3)-th cycle, since all the components TOX, TOY, and TOZ of the first instruction pipeline control signal 24 are "1", the instruction A is moved in the first instruction pipeline 10. During the latter half of the (m+3)-th cycle, the instruction A is moved from the Y1 stage 31 to the Y2 stage 32 in the first instruction pipeline 10, and the value in the counter latch 48 of the B2 stage 42 is determined by the counter circuit 81 and is set to "1". This process corresponds to the step 1003 of FIG. 13. At the same time, the instruction B enters the X2 stage 30 of the first instruction pipeline 10 and the A2 stage 40 of the second instruction pipeline 11, and the value of the counter latch 46 of the A2 stage 40 is set to an initial value "2" by the counter circuit 80. This process corresponds to the step 1001 of FIG. 13.

During the (m+4)-th cycle, all the components TOX, TOY, and TOZ of the first instruction pipeline control signal 24 are "0" again so that the advance of the instructions A and B in the first instruction pipeline 10 is stopped. At this time, in the second instruction pipeline 11, the counting operation of the counter latch 47 of the B1 stage 41 and the counter latch 49 of the C1 stage 43 is suspended. The second instruction pipeline controller 22 receives the information signals of the values in the counter latch 47 of the B1 stage 41 and the counter latch 49 of the C1 stage 43, and is thus informed of the positions of the instructions A and B in the first instruction pipeline 10, that is, which stages of the first instruction pipeline 10 are occupied by the instructions A and B. In this case, since the value in the counter latch 49 of the C1 stage 43 is "1", the controller 22 is informed that the instruction A is present in the Y2 stage 32 and the Z1 stage 33. In addition, since the value in the counter latch 47 of the B1 stage 41 is "2", the controller 22 is informed that the instruction B stays in the X2 stage 30 and the Y1 stage 31. This process corresponds to a step 1004 of FIG. 13.

In respect of the advance of the instruction A, the following synchronization between tile instruction pipelines 10 and 11 is established. The movement of the instruction A from the Z1 stage 33 of the first instruction pipeline 10 to a next stage, that is, the movement of the instruction A out of the first instruction pipeline 10, is synchronized with the movement of the instruction A from the C1 stage 43 to the C2 stage 44 in tile second instruction pipeline 11. In other words, the instruction A is advanced from the C1 stage 43 to the C2 stage 44 in the second instruction pipeline 11 at the same time as the moment of the movement of the instruction A out of the first instruction pipeline 10. The second instruction pipeline controller 22 realizes this synchronization by stopping the advance of the instruction A in the second instruction pipeline 11 in response to the information signal of the value in the counter latch 49 of the C1 stage 43 and the first instruction pipeline control signal 24. The stop of the advance of the instruction A is executed by use of the second instruction pipeline control signal (A1SEL, B1SEL, C1SEL) 25 being (2, 2, 0). This process corresponds to the step 1005 of FIG. 13.

During the (m+5)-th cycle, all the components TOX, TOY, and TOZ of the first instruction pipeline control signal 24 are "1" so that the instruction A advances in the first instruction pipeline 10. During the latter half of the (m+5)-th cycle, the first instruction pipeline control signal 24 and the value in the counter latch 49 of the C1 stage 43 inform that the instruction A moves out of the first instruction pipeline 10 (see the step 1004 of FIG. 13). The desired synchronization is established, and thus the second instruction pipeline controller 22 advances the instruction A to the C2 stage 44. Since the instruction A is advanced to the C2 stage 44, the instruction B is moved from the B1 stage 41 to the B2 stage 42 in the second instruction pipeline 11. At this time, the value in the counter latch 48 of the B2 stage 42 is determined by the counter circuit 81 and is set to "1". This process corresponds to the step 1003 of FIG. 13.

Since the instruction A already moves out of the first instruction pipeline 10, it is unnecessary establish the synchronization between the instruction pipelines 10 and 11 during the (m+6)-th cycle. Thus, during the (m+6)-th cycle, the instruction A advances in the second instruction pipeline 11 independent of the operation of the first instruction pipeline 10 (see steps 1007 and 1008 of FIG. 3). In respect of the instruction B, all the components TOX, TOY, and TOZ of the first instruction pipeline control signal 24 are "0" so that the target synchronization is not established (see the seep 1004 of FIG. 13). During the first half of the (m+6)-th cycle, the instruction B moves from the B2 stage 42 to the C1 stage 43 of the second instruction pipeline 11. At the same time, "1" being the value in the counter latch 48 of the B2 stage 42 is set in the counter latch 49 of the C1 stage 43 as it is. The instruction B stays the B2 stage 42 and the C1 stage 43. This process corresponds to the step 1005 of FIG. 13.

During the (m+7)-th cycle, all the components TOX, TOY, and TOZ of the first instruction pipeline control signal 24 are "1" so that the instruction B advances in the first instruction pipeline 10. During the latter half of the (m+7)-th cycle, the second instruction pipeline controller 22 is informed by the first instruction pipeline control signal 24 and the value of the counter latch 49 of the C1 stage 43 that the instruction B moves out of the first instruction pipeline 10 (see the step 1004 of FIG. 13). Thus, the desired synchronization is established (see the step 1006 of FIG. 13), and the second instruction pipeline controller 22 advances the instruction B to the C2 stage 44.

During subsequent cycles, since the instruction B is already outside the first instruction pipeline 10, it is unnecessary to establish the synchronization between tile instruction pipelines 10 and 11. Thus, the instruction B is advanced in the second instruction pipeline 11 independent of the operation of the first instruction pipeline 10. This process corresponds to the steps 1007 and 1008 of FIG. 13.

In this way, the values in the counter latches 46-49 in the second instruction pipeline 11 are determined by the pipeline control signals 24 and 25. It is possible to establish the synchronization between the instruction pipelines 10 and 11 by controlling the advance of an instruction in the second instruction pipeline 11 in accordance with the values of the counter latches.

The synchronization may be established between the Y2 stage 32 of the first instruction pipeline 10 and the C2 stage 44 of the second instruction pipeline 11 in a way similar to the previously-mentioned synchronization way. In addition, the synchronization may be established between the Y2 stage 32 of the first instruction pipeline 10 and the B2 stage 42 of the second instruction pipeline 11 in a way similar to the previously-mentioned synchronization way.

In general cases where a first instruction pipeline has "n" stages while a second instruction pipeline has "m" stages, the synchronization can be established between the "i"-th stage of the first instruction pipeline and the "j"-th stage of the second instruction pipeline in a way similar to the previously-mentioned synchronization way, where "i"≦"n" and "j"≦"m" In these cases, by discriminating between instructions, the combination of the stages of the first and second instruction pipelines between which the synchronization is established can be changed in dependence upon the type of a related instruction, and also the determination as to whether or not the synchronization is established can be made in dependence upon the type of a related instruction.

In a pipelined computer driven by a single-phase clock signal or a pipelined computer driven by multi-phase clock signals other than bi-phase clock signals, a similar synchronization can be established between instruction pipelines.

In this embodiment, the down counter circuits and the counter latches compose counters serving as condition holding means for monitoring the advance of an instruction in the first instruction pipeline 10. The condition holding means may be formed by condition holding flag means composed of a condition flag generator generating a flag corresponding to the stage which contains the related instruction and a condition flag temporarily-holding circuit.

The central part of most of general microprocessor units is composed of an integer unit. Some advanced microprocessor units have an integrated structure including a floating-point processing unit, a cache memory, a memory management unit, arid a bus control unit. One example of the pipelined computer is a microprocessor unit with an on-chip floating-point processing unit. In this case, the first instruction pipeline 10 corresponds to an integer unit while the second instruction pipeline 11 corresponds to the floating-point processing unit.

It should be noted that the down counter circuits may be replaced by up counter circuits.

DESCRIPTION OF THE THIRD PREFERRED EMBODIMENT

A third embodiment of this invention is similar to the embodiment of FIGS. 2-14 except for an additional arrangement and a design change indicated later.

Figure 15:
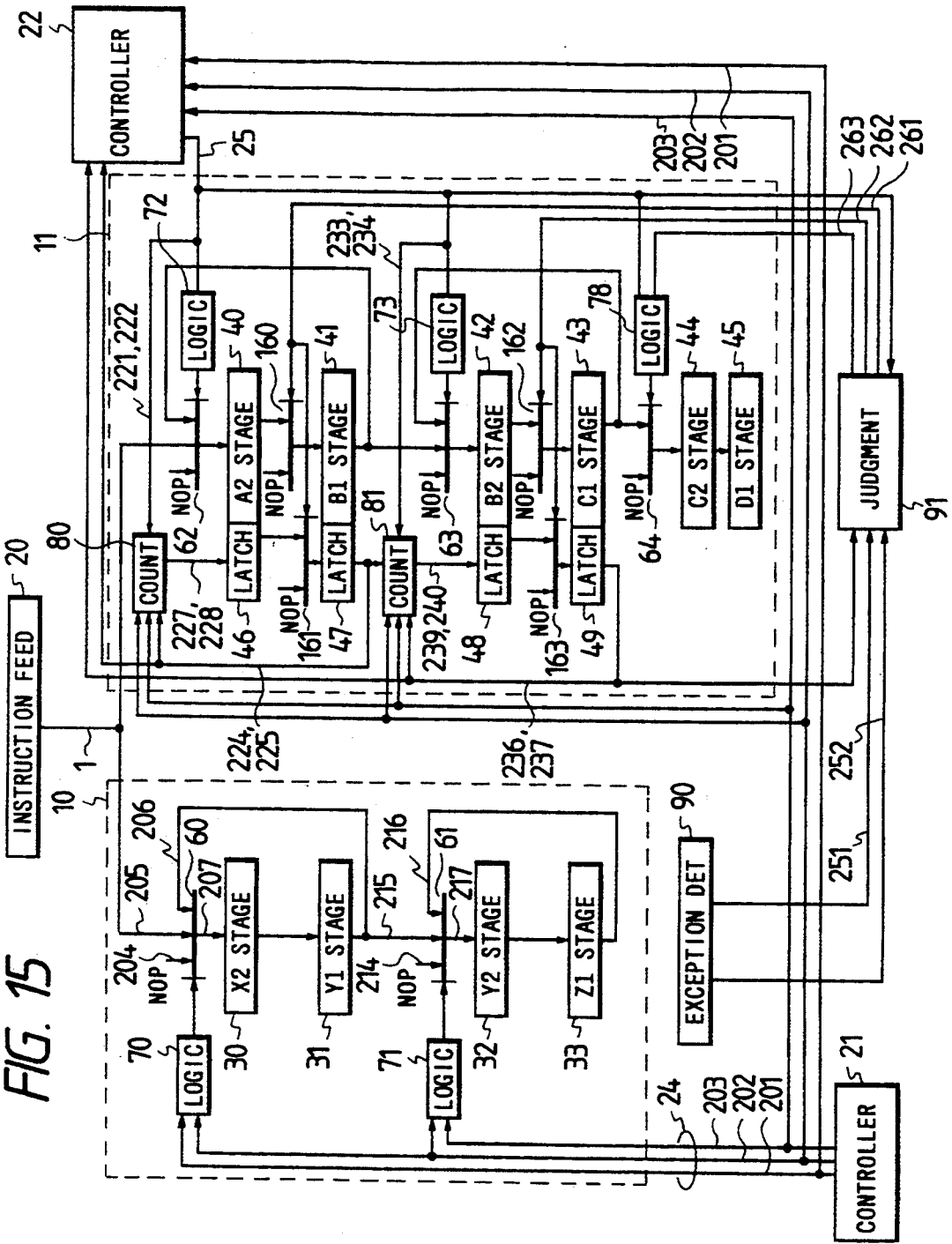
FIG. 15 is a block diagram of a pipelined computer according to a third embodiment of this invention.

With reference to FIG. 15, a pipelined computer includes a known exception detector 90, a judgment section 91, and selectors 160, 161, 162, and 163. The exception detector 90 outputs detection signals YEXP 251 and ZEXP 252 representing exceptions in a Y stage and a Z stage of the first instruction pipeline 10 respectively. The judgment section 91 receives the exception detection signals YEXP 251 and ZEXP 252, a signal representing a value in a counter latch 49 of a C1 stage 43 of a second instruction pipeline 11, and a second instruction pipeline control signal 25. The judgment section 91 generates signals 261, 262, and 263 on the basis of the received signals. The signals 261-263 serve to disable instructions in stages in the second instruction pipeline 11. The selectors 160 and 161 are controlled by the output signal (KIL—B1) 261 from the judgment section 91. The selectors 162 and 163 are controlled by the output signal (KIL—C1) 262 of the judgment section 91.

Figure 16:
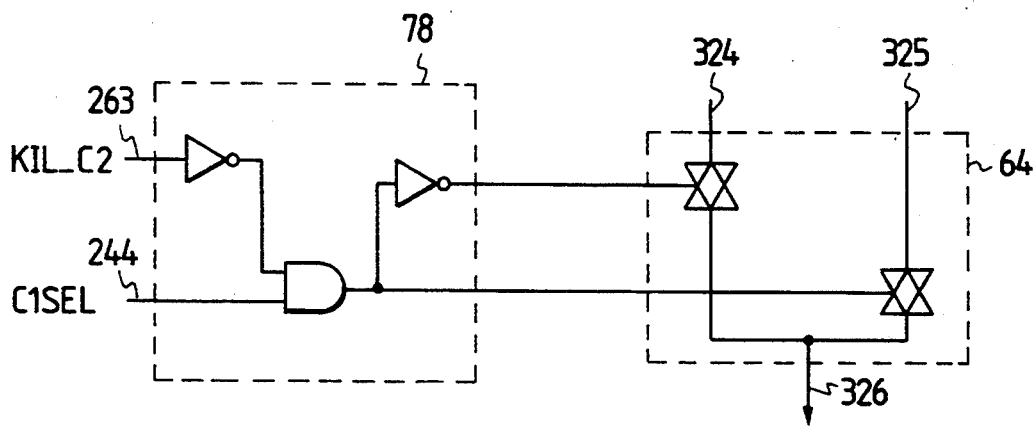
FIG. 16 is a block diagram of the logic circuit and the selector in the pipelined computer of FIG. 15.

A logic circuit 78 is used in place of the logic circuit 74 of FIG. 2. The logic circuit 78 receives the output signal (KIL—C2) 263 from the judgment section 91. As shown in FIG. 16, an input selector 64 includes switches controlled by output signals from the logic circuit 78. The logic circuit 78 includes inverters and an AND gate. The logic circuit 78 receives a C1SEL 244 of a control signal 25 and the signal (KIL—C2) 263, and generates switch control signals on the basis of the C1SEL 244 and the KIL—C2 263. The switch control signals are fed from the logic circuit 78 to the switches of the input selector 64. The switches of the input selector 64 control the selection and the transmission of an instruction 324 corresponding to NOP and an instruction 325 from a C1 stage 43 in accordance with the switch control signals. The instruction 326 selected by the input selector 64 is transmitted to a C2 stage 44.

The design of the selectors 160–164 is similar to the design of the selector 64 of FIG. 9. The selectors 160 and 161 determine whether or not an instruction in the second instruction pipeline 11 is replaced by an instruction corresponding to NOP in response to the signal (KIL—B1) 261. The selectors 162 and 163 determine whether or not an instruction in the second instruction pipeline 11 is replaced by an instruction corresponding to NOP in response to the signal (KIL—C1) 262.

Figure 17:
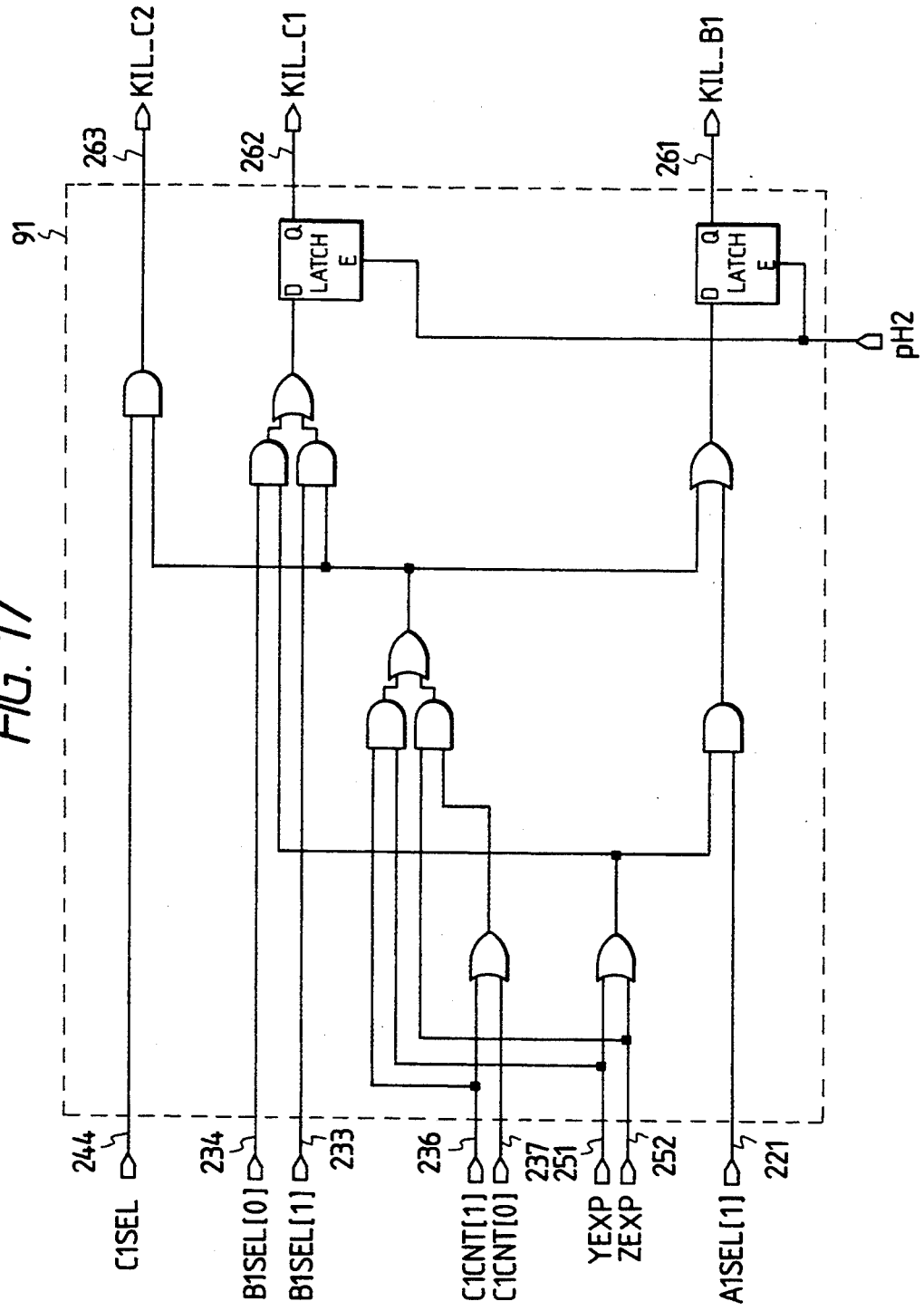
FIG. 17 is a block diagram of the judgment section in the pipelined computer of FIG. 15.

As shown in FIG. 17, the judgment section 91 includes a combination of AND gates, OR gates, and latches. The judgment section 91 generates the instruction disabling signals (KIL—B1, KIL—C1, KIL—C2) 261–263 in response to the exception detection signals YEXP 251 and ZEXP 252, the A1SEL[1] 221, the B1SEL[1] 233, the B1SEL,[0] 234, and the C1SEL of the second instruction pipeline control signal 25, and the C1CNT[1] 236 and the C1CNT[0] 237 of the signal representing the value in the counter latch 49 of the C1 stage 43. The judgment section 91 determines the stage of the second instruction pipeline 11 at which an instruction is disabled on the basis of the exception detection signals YEXP 251 and ZEXP 252, the second instruction pipeline control signal 25, and the signal representing the value in the counter latch 49 of the C1 stage 43.

Figure 18:
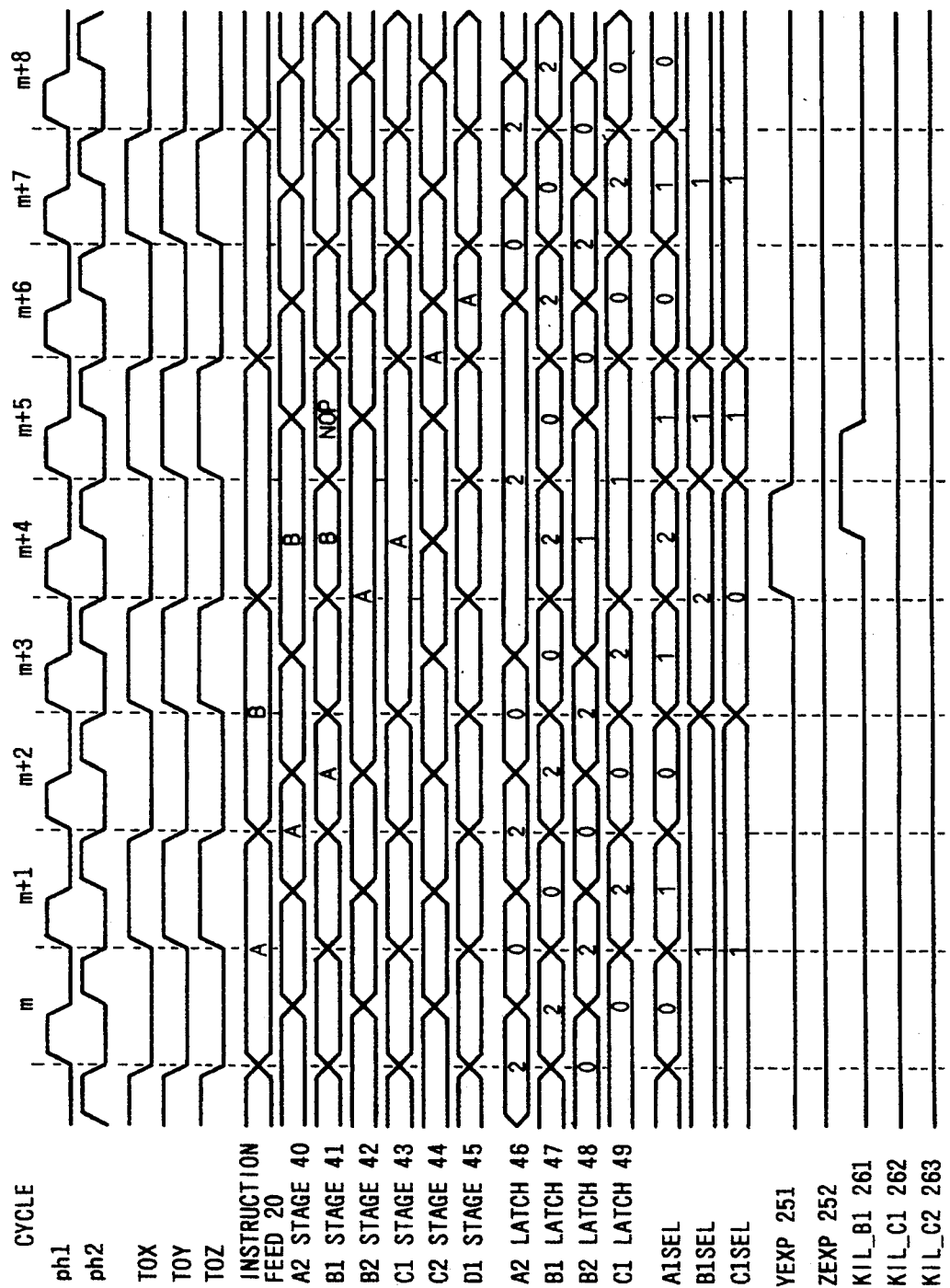
FIG. 18 is a timing diagram showing conditions of various portions and various signals in the pipelined computer of FIG. 15.
Figure 19:
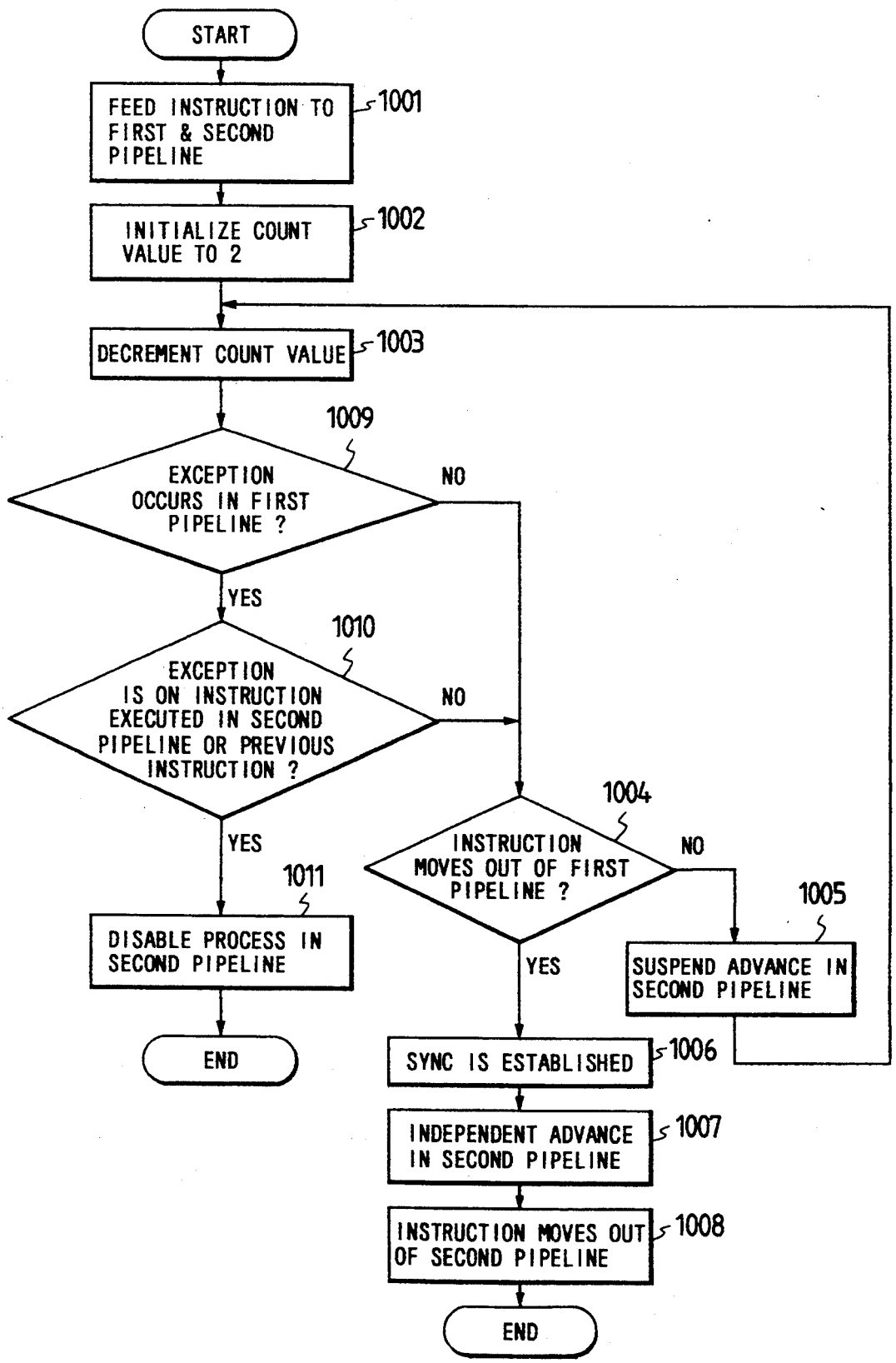
FIG. 19 is a flowchart of an instruction disabling process in the pipelined computer of FIG. 15.

The operation of the pipelined computer will be described hereinafter with reference to FIGS. 18 and 19. An attention is now paid to the exception detection signals YEXP 251 and ZEXP 252 generated by the exception detector 90. During the (m+4)-th cycle, an exception in the Y1 stage of the first instruction pipeline 10 is detected in relation to an instruction B which is processed by not only the second instruction pipeline 11 but also the first instruction pipeline 10, so that the exception detection signal YEXP 251 becomes "1". This process corresponds to a step 1009 of FIG. 19. The judgment section 91 determines the stage of the second instruction pipeline 11 at which the disabling of an instruction is executed on the basis of the exception detection signal YEXP 251, the second instruction pipeline control signal 25, and the value in the counter latch 49 of the C1 stage 49. This process corresponds to a step 1010 of FIG. 19. In this case, during the latter half of the (m+4)-th cycle, tile selector control signal (KIL—B1) 261 for disabling an instruction at the B1 stage 41 becomes "1".

During the first half of the (m+5)-th cycle, the instruction A stays in the B2 stage 42 and the C1 stage 43 while the instruction B is prevented from staying in the B1 stage 41 and is replaced with an instruction corresponding to NOP by the selectors 160 and 161 controlled via the selector control signal (KIL—B1) 261. At the same time, the value in a counter latch 47 of the B1 stage 41 is set to "0". This process corresponds to a step 1011 of FIG. 19. During the (m+5)-th cycle, all components TOX, TOY, and TOZ of a first instruction pipeline control signal 24 are "1", the instructions A and B advance in the first instruction pipeline 10. During the latter half of the (m+5)-th cycle, the second instruction pipeline controller 22 is informed by the first instruction pipeline control signal 24 and the value of the counter latch 49 of the C1 stage 43 that the instruction A moves out of the first instruction pipeline 10 (see a step 1004 of FIG. 19), so that the desired synchronization is established (see a step 1006 of FIG. 19) and thus the controller 22 advances the instruction A to the C2 stage 44. In addition, the instruction B is advanced from the Y1 stage 31 to the Y2 stage 32 in the first instruction pipeline 10 and the instruction B is advanced from the B1 stage 41 to the B2 stage 42 in the second instruction pipeline 11. Since the instruction B is already disabled in the second instruction pipeline 11, nothing is executed in relation to the instruction B.

During subsequent cycles, since the instruction A is already outside the first instruction pipeline 10, it is unnecessary to establish the synchronization between the instruction pipelines 10 and 11 in respect of the instruction A. Thus, the instruction A is advanced in the second instruction pipeline 11 independent off the operation of the first instruction pipeline 10. Since the instruction B is replaced by an instruction corresponding to NOP, it is unnecessary to establish the synchronization between the instruction pipelines 10 and 11 in respect of the instruction B. Thus, the instruction B is independently advanced in the second instruction pipeline 11. This process corresponds to steps 1007 and 1008 of FIG. 19.

Figure 20:
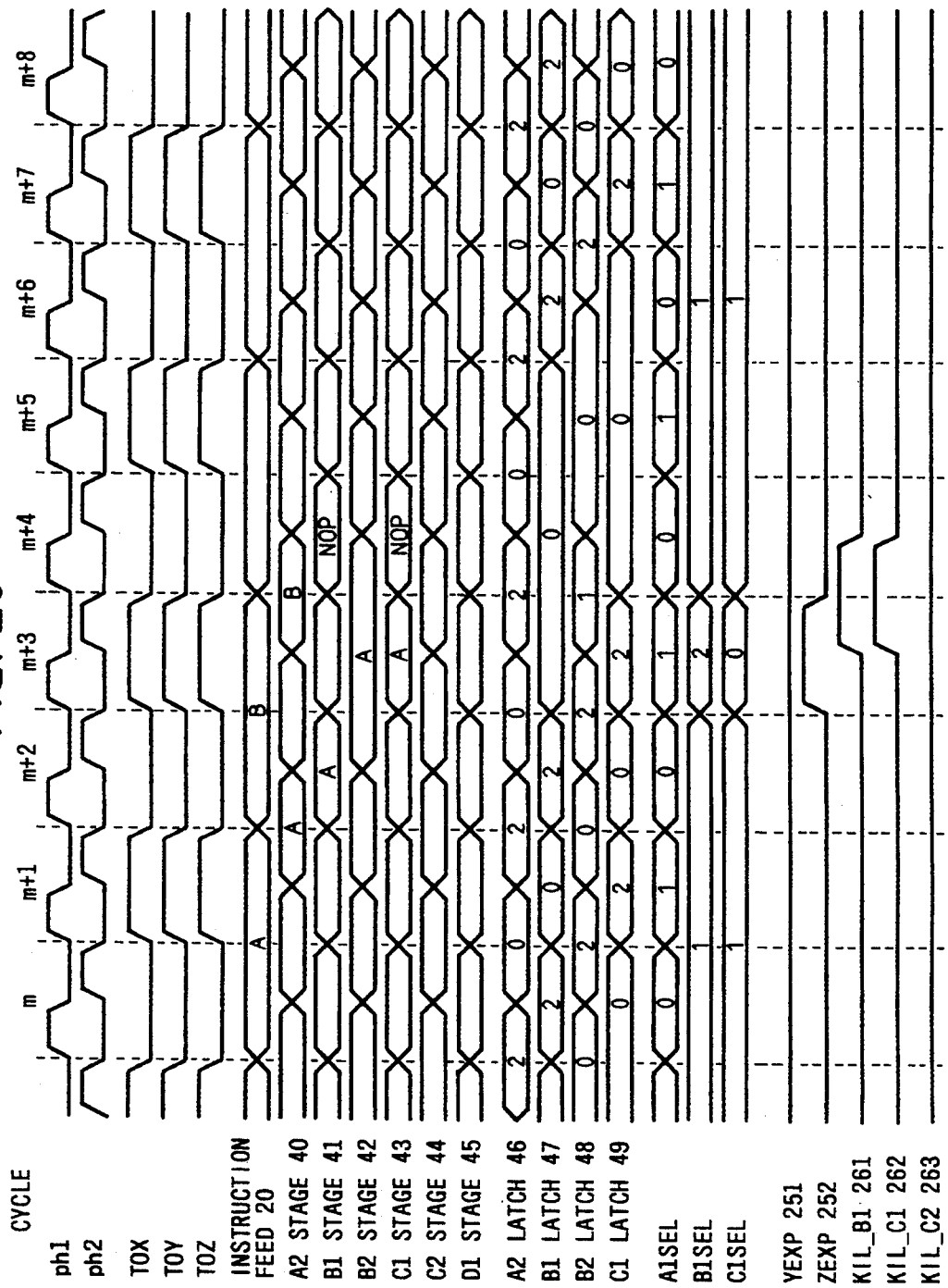
FIGS. 20 and 21 are timing diagrams showing conditions of various portions and various signals in the pipelined computer of FIG. 15.

The operation of the pipelined computer will be described hereinafter with reference to FIGS. 19 and 20. An attention is now paid to the exception detection signals YEXP 251 and ZEXP 252 generated by the exception detector 90. During the (m+3)-th cycle, an exception is detected in relation to an instruction which precedes the instruction A, so that the exception detection signal ZEXP 252 becomes "1" This process corresponds to the step 1009 of FIG. 19. The judgment section 91 determines the stages of the second instruction pipeline 11 at which the disabling of instructions is executed on the Basis of the exception detection signal ZEXP 252, the second instruction pipeline control signal 25, and the value in the counter latch 49 of the C1 stage 49. This process corresponds to the step 1010 of FIG. 19. In this case, during the latter half of the (m+3)-th cycle, the selector control signal (KIL—B1) 261 for disabling an instruction at the B1 stage 41 and also the selector control signal (KIL—C1) 262 for disabling an instruction at the C1 stage 43 become "1".

During the first half of the (m+4)-th cycle, the instruction A is prevented from staying in the C1 stage 43 and is replaced with an instruction corresponding to NOP since the selectors 162 and 163 are controlled by the selector control signal (KIL—C1) 262. At the same time, the value in the counter latch 49 of the C1 stage 43 is set to "0" In addition, the instruction B is disabled in the B1 stage 41 and is replaced with an instruction corresponding to NOP since the selectors 160 and 161 are controlled by the selector control signal (KIL—B1) 261. At the same time, the value in the counter latch 47 of the B1 stage 41 is set to "0". This process corresponds to the step 1011 of FIG. 19. In the second instruction pipeline 11, the instructions in the stages up to the C1 stage 43 are disabled, and thus it is unnecessary to establish the synchronization between the instruction pipelines 10 and 11 so that the instructions are independently advanced.

Figure 21:
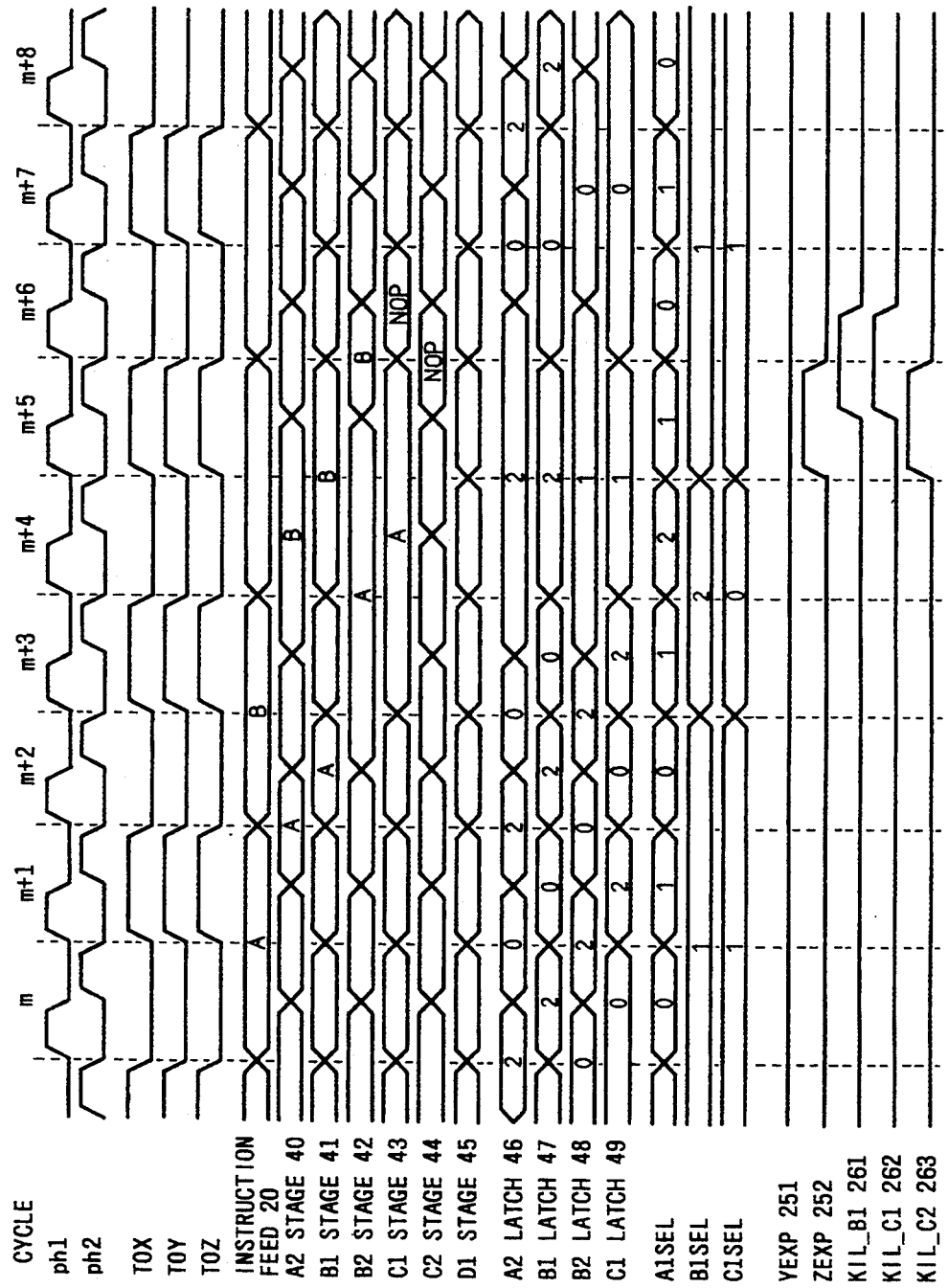

The operation of the pipelined computer will be described hereinafter with reference to FIGS. 19 and 21. An attention is now paid to the exception detection signals YEXP 251 and ZEXP 252 generated by the exception detector 90. During the (m+5)-th cycle, an exception is caused by an interruption from an exterior of the instruction pipelines 10 and 11, and this exception is detected so that the exception detection signal ZEXP 252 becomes "1". This process corresponds to the step 1009 of FIG. 19. The judgment section 91 determines the stages of the second instruction pipeline 11 at which the disabling of instructions is executed on the basis of the exception detection signal ZEXP 252, the second instruction pipeline control signal 25, and the value in the counter latch 49 of the C1 stage 49. This process corresponds to the step 1010 of FIG. 19. In this case, the selector control signal (KIL_C2) 263 for disabling an instruction in the C2 stage 44 becomes "1" during the first half of the (m+5)-th cycle, and the selector control signal (KIL_B1) 261 for disabling an instruction in the B1 stage 41 and also the selector control signal (KIL_C1) 262 for disabling an instruction in the C1 stage 43 become "1" during the latter half of the (m+5)-th cycle. During the latter half of the (m+5)-th cycle, since the selector 64 is controlled by the logic circuit 78 in response to the selector control signal (KIL_C2) 263, the instruction A is replaced by an instruction corresponding to NOP while the instruction A is moved from the C1 stage 43 to the C2 stage 44. This process corresponds to the step 1011 of FIG. 19.

During the first half of the (m+6)-th cycle, since the selectors 162 and 163 are controlled by the selector control signal (KIL_C1) 262, the instruction B is replaced by an instruction corresponding to NOP while the instruction is moved from the B2 stage 42 to the C1 stage 43. At the same time, the value in the counter latch 49 of the C1 stage 43 is set to "0" In the case where the instruction following the instruction B should be processed by the second instruction pipeline 11, since the selectors 160 and 161 are controlled by the selector control signal (KIL_B1) 261, the instruction following the instruction B is disabled in the B1 stage 41 and is replaced by an instruction corresponding to NOP. At the same time, the value in the counter latch 47 of the B1 stage 41 is set to "0". This process corresponds to the step 1011 of FIG. 19. All the instructions are replaced by the instructions corresponding to NOP in the second instruction pipeline 11, and thus it is unnecessary to establish the synchronization between the instruction pipelines 10 and 11 so that the instructions are independently advanced in the second instruction pipeline 11.

One example of the pipelined computer is a microprocessor unit with an on-chip floating-point processing unit. In this case, the instruction A is a calculating instruction in the floating-point processing unit while the instruction B is an instruction for transferring data between an integer unit and the floating-point processing unit. FIG. 18 shows a data access exception (during the execution of the instruction B) which occurs when the access to a cache memory or others is done in the integer unit to read out data to be Transferred to the floating-point processing unit. FIG. 20 shows an exception which occurs in the integer unit at the time of the execution of the instruction immediately prior to the calculating instruction (the instruction A) in the floating-point processing unit. FIG. 21 shows an exception which is caused by an interruption from an exterior of the microprocessor unit during the execution of the instructions by both the integer unit and floating-point processing unit. As explained previously, when an exception occurs, the contents of the registers within the pipelined computer (the microprocessor unit) are prevented from being updated by the execution of instructions following the instruction related to the exception in compliance with the principle that the contents of the registers in the pipelined computer (the microprocessor unit) need to be updated in the same sequence as the sequence of the execution of the instructions.

DESCRIPTION OF THE FOURTH PREFERRED EMBODIMENT

Figure 22:
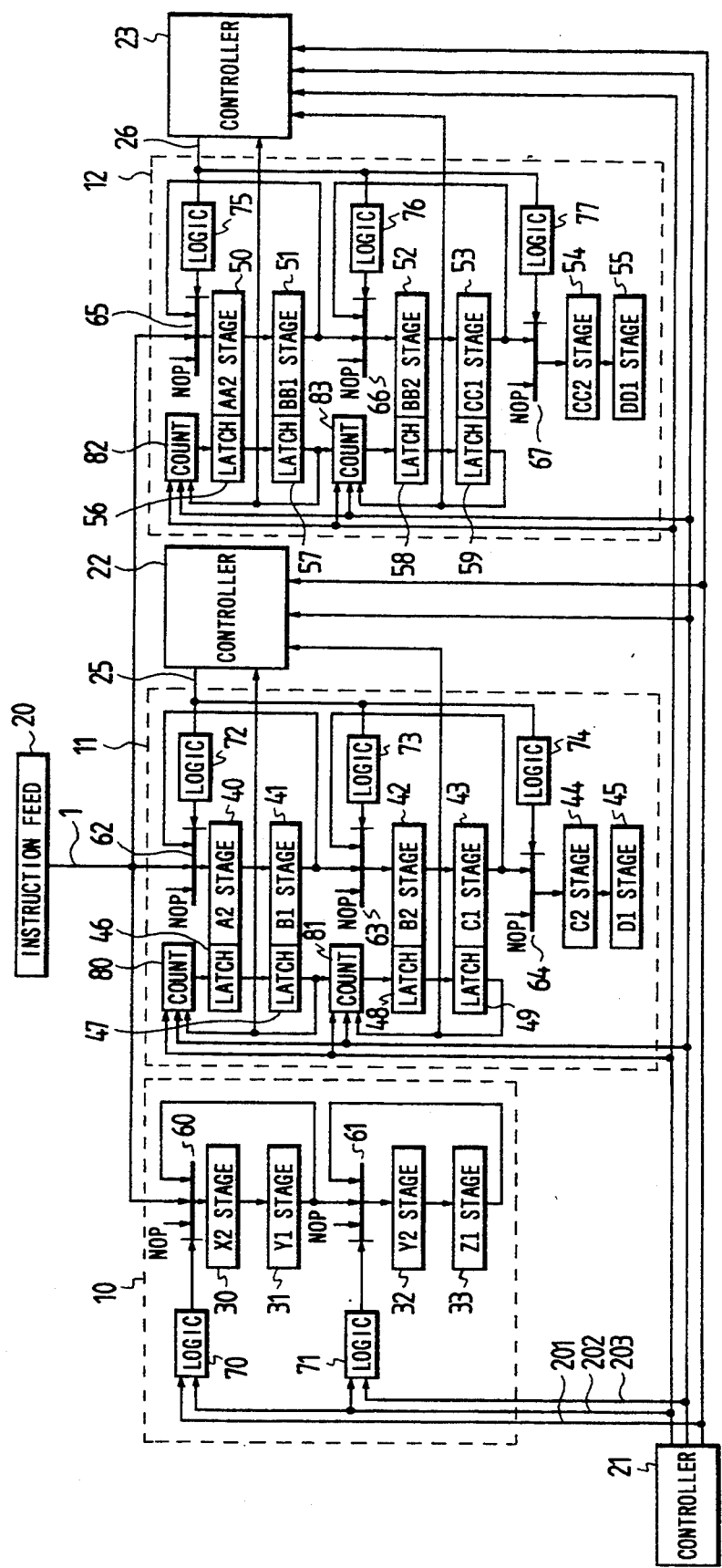
FIG. 22 is a block diagram of a pipelined computer according to a fourth embodiment of this invention.
Figure 23:
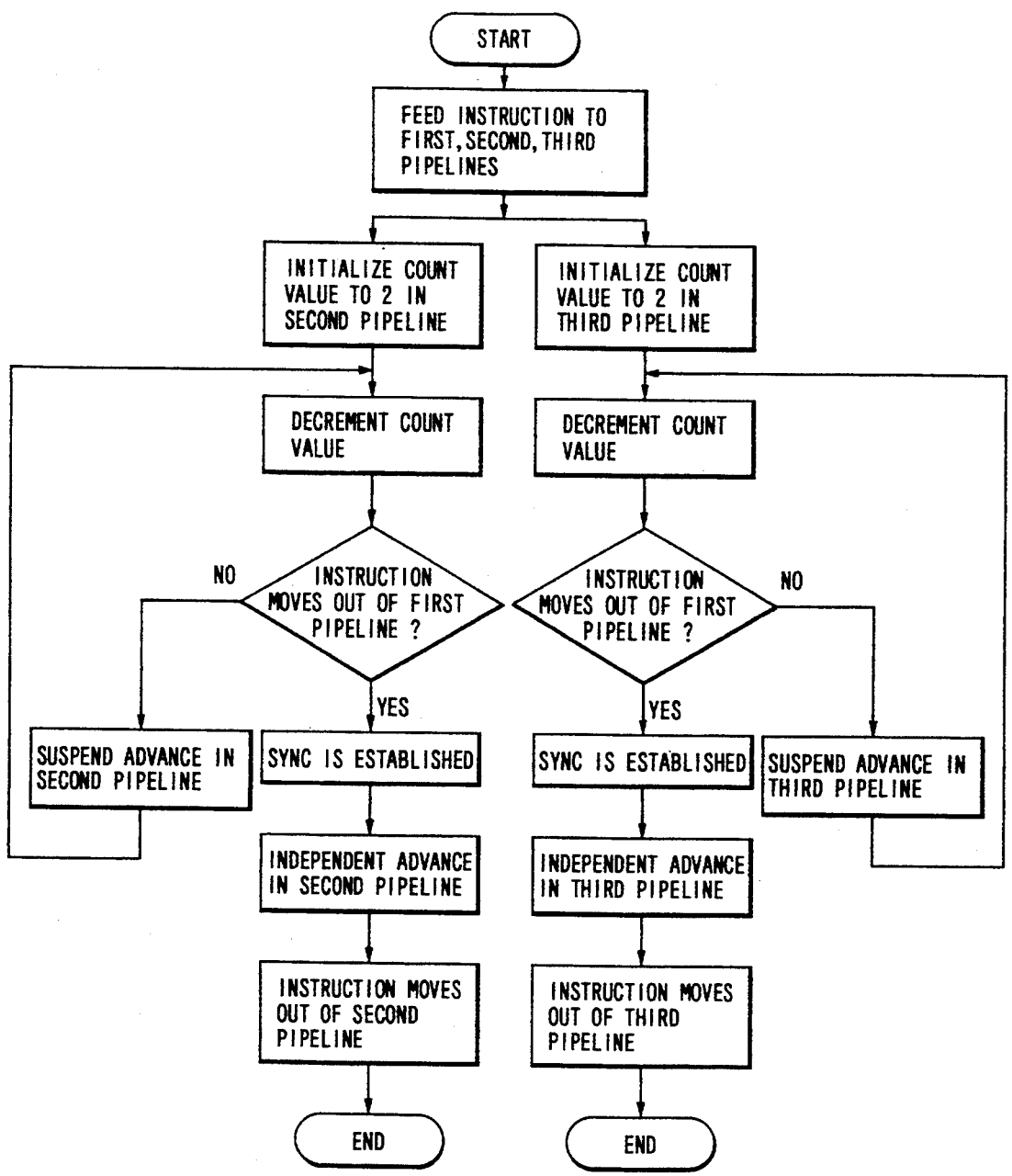
FIG. 23 is a flowchart of a synchronizing process in the pipelined computer of FIG. 22.

FIGS. 22 and 23 relate to a fourth embodiment of this invention which is similar to the embodiment of FIGS. 2-14 except for an additional arrangement indicated hereinafter. As shown in FIG. 22, the fourth embodiment includes a third instruction pipeline 12 and a third instruction pipeline controller 23. The design of the third instruction pipeline 12 is similar to the design of a second instruction pipeline 31. The third instruction pipeline 12 has a first stage composed of an AA2 sub stage 50 and a BB1 sub stage 51, a second stage composed of a BB2 sub stage 52 and a CC1 sub stage 53, and a third stage composed of a CC2 sub stage 54 and a DD1 sub stage 55. The third instruction pipeline 12 includes counter circuits 82 and 83. The AA2 stage 50, the BB1 stage 51, the BB2 stage 52, and the CC1 stage 53 are provided with counter latches 56, 57, 58, and 59 respectively. The third instruction pipeline 12 includes input selectors 65, 66, and 67 which are controlled by signals outputted from logic circuits 75, 76, and 77. As understood from FIG. 23, the synchronization related to the third instruction pipeline 12 is similar to the synchronization related to the second instruction pipeline 11. Accordingly, it is possible to establish the synchronization between the instruction pipelines 10 and 11 and also the synchronization between the instruction pipelines 10 and 12.

DESCRIPTION OF THE FIFTH PREFERRED EMBODIMENT

Figure 24:
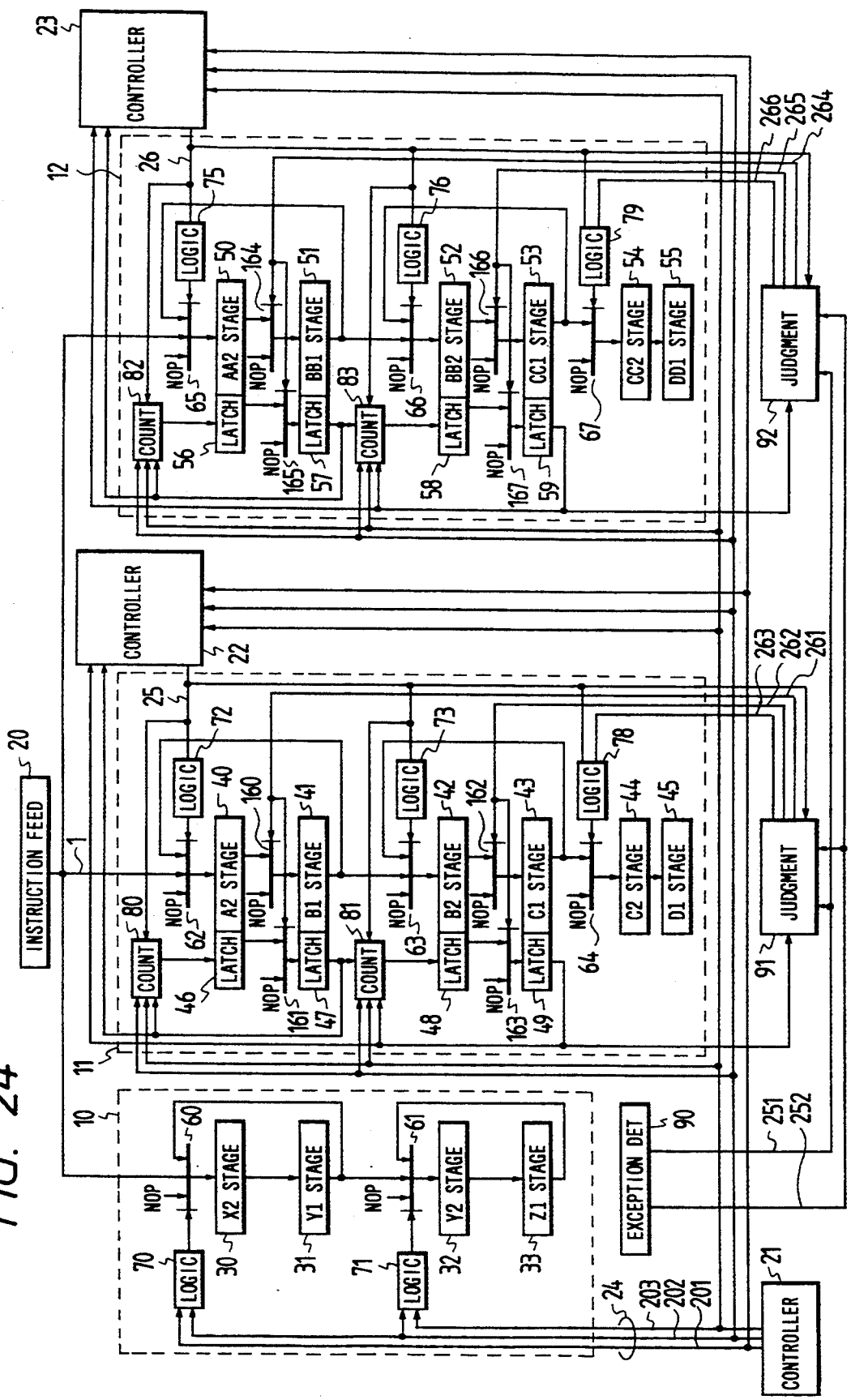
FIG. 24 is a block diagram of a pipelined computer according to a fifth embodiment of this invention.
Figure 25:
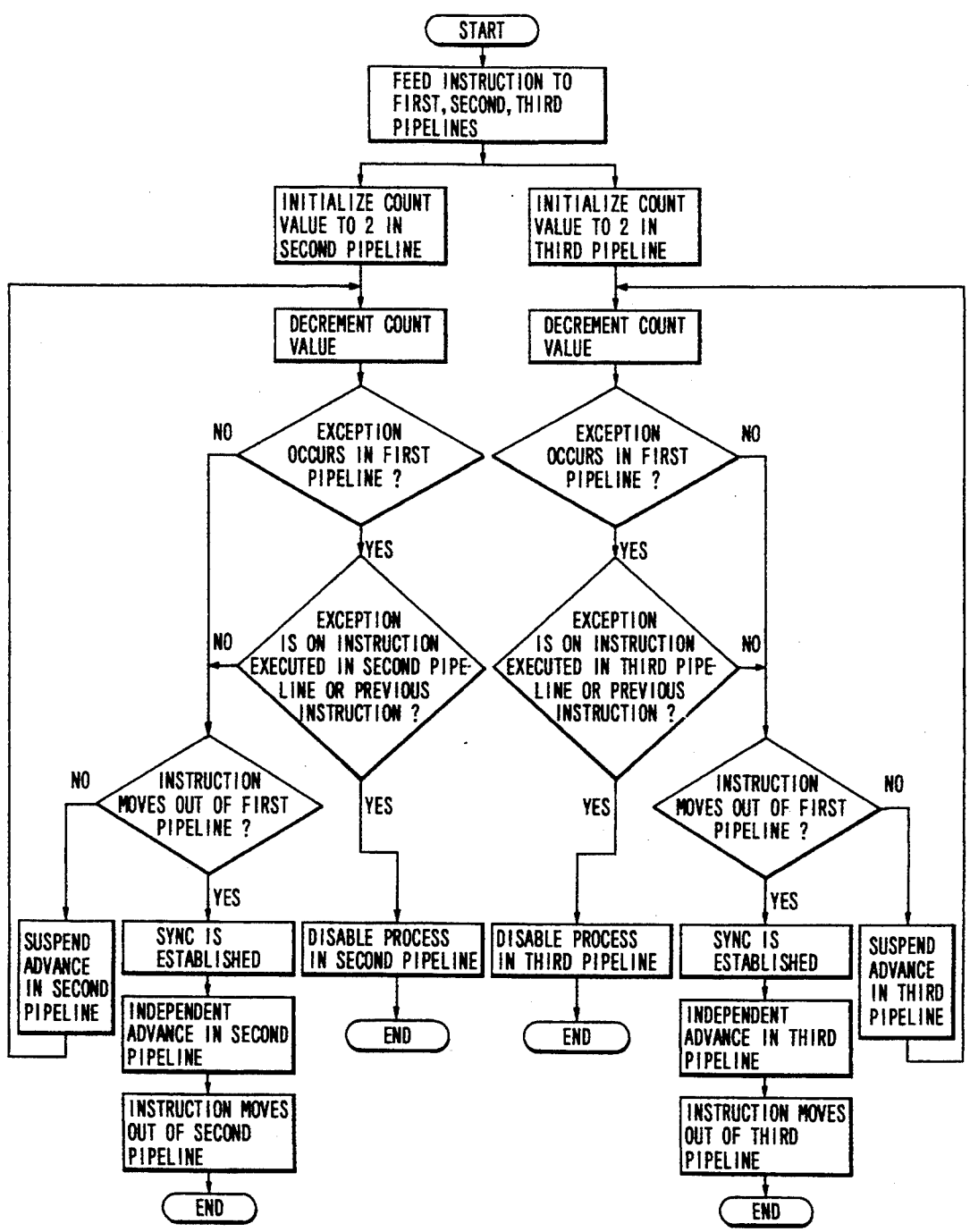
FIG. 25 is a flowchart of an instruction disabling process in the pipelined computer of FIG. 24.

FIGS. 24 and 25 relate to a fifth embodiment of this invention which is similar to the embodiment of FIGS. 15-21 except for an additional arrangement indicated hereinafter. As shown in FIG. 24, the fifth embodiment includes a third instruction pipeline 12, a third instruction pipeline controller 23, and a judgment section 92. The design of the third instruction pipeline 12 is similar to the design of a second instruction pipeline 11. The design of the judgment section 92 is similar to the design of the judgment section 91. The third instruction pipeline 12 has a first stage composed of an AA2 sub stage 50 and a BB1 sub stage 51, a second stage composed of a BB2 sub stage 52 and a CC1 sub stage 53, and a third stage composed of a CC2 sub stage 54 and a DD1 sub stage 55. The third instruction pipeline 12 includes counter circuits 82 and 83. The AA2 stage 50, the BB1 stage 51, the BB2 stage 52, and the CC1 stage 53 are provided with counter latches 56, 57, 58, and 59 respectively. The third instruction pipeline 12 includes input selectors 65, 66, and 67 which are controlled by signals outputted from logic circuits 75, 76, and 79. The third instruction pipeline 12 also includes input selectors 164, 165, 166, and 167. The input selectors 164, 165, 166, 167, and 67 in the third instruction pipeline 12 are controlled by control signals 264, 265, and 266 outputted from the judgment section 92 as the input selectors 160, 161, 162, 163, and 64 in the second instruction pipeline 11 are controlled by the control signals 261, 262, and 263 outputted from the judgment section 91. As understood from FIG. 25, the instruction disabling process related to the third instruction pipeline 12 is similar to the instruction disabling process related to the second instruction pipeline 11. Accordingly, it is possible to establish the instruction disabling process between the instruction pipelines 10 and 11 and also the instruction disabling process between the instruction pipelines 10 and 12.

DESCRIPTION OF THE SIXTH PREFERRED EMBODIMENT

Figure 26:
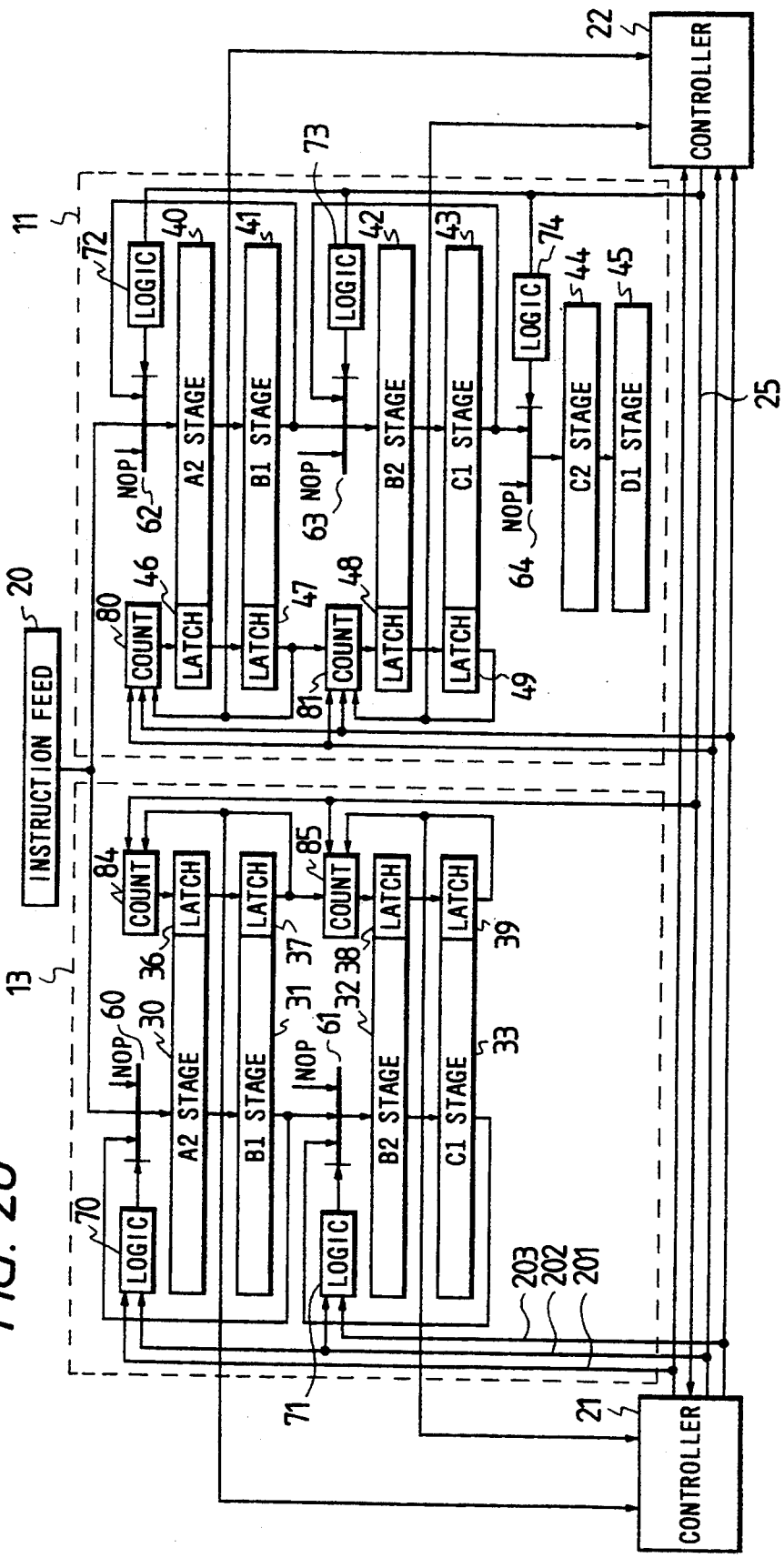
FIG. 26 is a block diagram of a pipelined computer according to a sixth embodiment of this invention.
Figure 27:
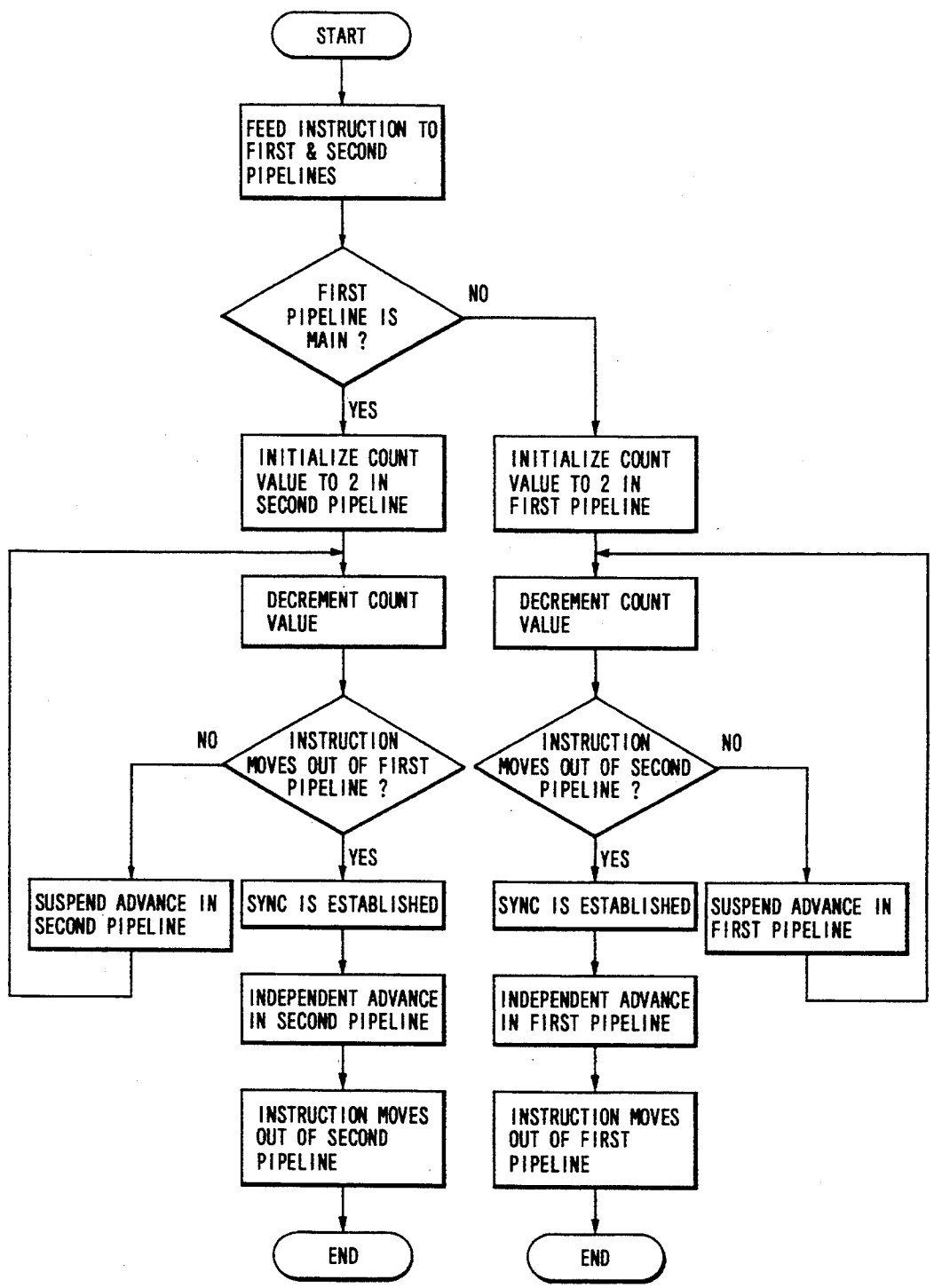
FIG. 27 is a flowchart of a synchronizing process in the pipelined computer of FIG. 26.

FIGS. 26 and 27 relate to a sixth embodiment of this invention which is similar to the embodiment of FIGS. 2-14 except for an additional arrangement indicated hereinafter. As shown in FIG. 26, in the sixth embodiment, a first instruction pipeline 13 includes counter circuits 84 and 85. In addition, an A2 stage 30, a B1 stage 31, a B2 stage 32, and a C1 stage 33 in the first instruction pipeline 13 are provided with counter latches 36, 37, 38, and 39 respectively. The counter latches 36-39 serve to count a unit of the advance of the instructions in the second instruction pipeline 11. As understood from FIG. 27, the synchronization between the first instruction pipeline 13 and a second instruction pipeline 11 can be established in a manner such that the first instruction pipeline 18 depends on the second instruction pipeline 11. As in the embodiment of FIGS. 2-14, the synchronization between the instruction pipelines 11 and 13 can be established also in a manner such that the second instruction pipeline 11 depends on the first instruction pipeline 13. By discriminating instructions in the instruction pipelines 11 and 13, the dependency between the instruction pipelines 11 and 13 can be changed with the results of the discrimination of the instructions during the synchronization between the instruction pipelines 11 and 13.

DESCRIPTION OF THE SEVENTH PREFERRED EMBODIMENT

Figure 28:
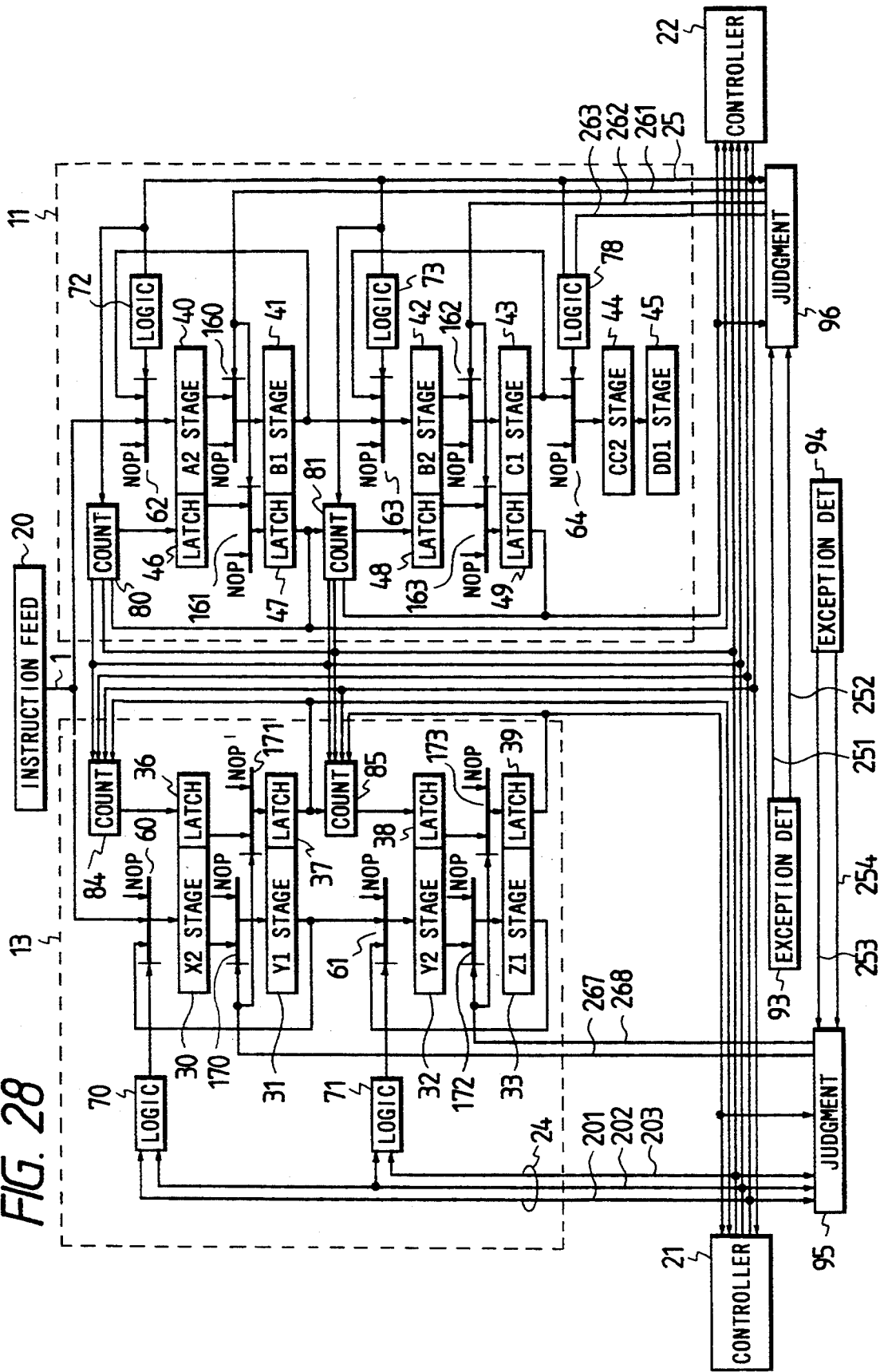
FIG. 28 is a block diagram of a pipelined computer according to a seventh embodiment of this invention.
Figure 29:
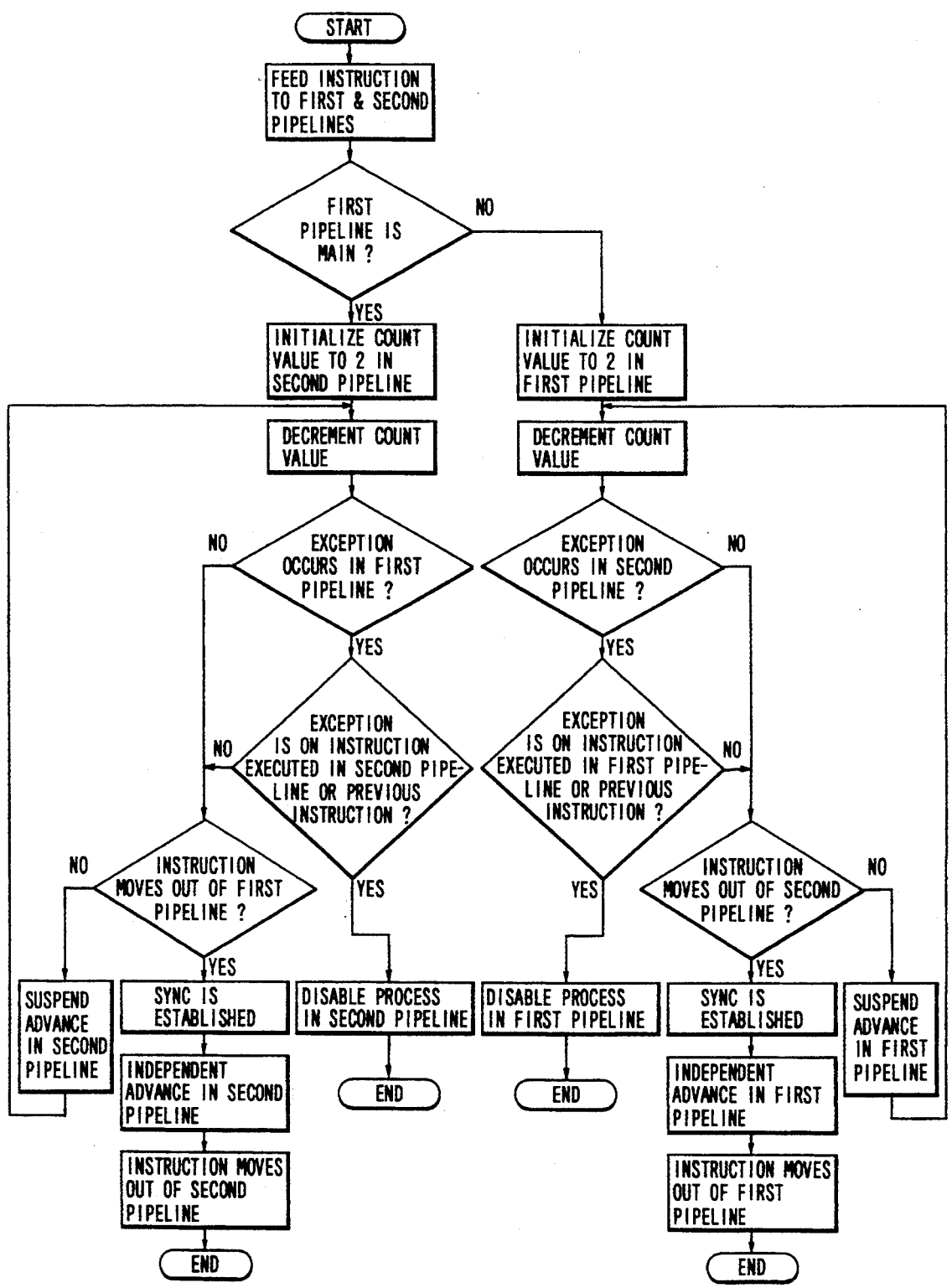
FIG. 29 is a flowchart of an instruction disabling process in the pipelined computer of FIG. 28.

FIGS. 28 and 29 relate to a seventh embodiment of this invention which is similar to the embodiment of FIGS. 15-21 except for an additional arrangement and a design change indicated hereinafter. As shown in FIG. 28, the seventh embodiment includes a known exception detector 93 for detecting an exception in a first instruction pipeline 13, and a known exception detector 94 for detecting an exception in a second instruction pipeline 11. In addition, the seventh embodiment includes a judgment section 95 for determining whether or not an instruction executed in the first instruction pipeline 13 is disabled, and a judgment section 96 for determining whether or not an instruction executed in the second instruction pipeline 11 is disabled. The first instruction pipeline 13 includes counter circuits 84 and 85. In addition, an A2 stake 30, a B1 stake 31, a B2 stage 32, and a C1 stake 33 in the first instruction pipeline 13 are provided with counter latches 36, 37, 38, and 39 respectively. The counter latches 36-39 serve to count a unit of the advance of the instructions in the second instruction pipeline 11. The first instruction pipeline 13 includes input selectors 170, 171, 172, and 173 whose structure is similar to the structure of selectors 64 and 160 in the second instruction pipeline 11.

As understood from FIG. 29, an instruction or instructions in the first instruction pipeline 13 can be disabled in response to the occurrence of an exception in the second instruction pipeline 11. As in the embodiment of FIGS. 15-21, an instruction or instructions in the second instruction pipeline 11 can be disabled in response to the occurrence of an exception in the first instruction pipeline 13. The instruction disabling process can be performed in a manner such that the second instruction pipeline 11 depends on the first instruction pipeline 13. The instruction disabling process can be performed also in a manner such that the first instruction pipeline 13 depends on the second instruction pipeline 11. By discriminating instructions in the instruction pipelines 11 and 13, the dependency between the instruction pipelines 11 and 13 can be changed with the results of the discrimination of the instructions during the instruction disabling process.

What is claimed is:

1. A method of synchronization in a pipelined computer having a first instruction pipeline and a second instruction pipeline, the first instruction pipeline having "n" stages, the second instruction pipeline having "m" stages, the method comprising the steps of:

feeding an identical instruction to the first instruction pipeline and the second instruction pipeline substantially simultaneously;

advancing the instruction in the first instruction pipeline;

advancing the instruction in the second instruction pipeline;

detecting a position of the instruction in the first instruction pipeline; and stopping advance of the instruction in a "j"-th stage of the second instruction pipeline in response to the detected position of the instruction in the first instruction pipeline until the instruction reaches an "i"-th stage of the first instruction pipeline to synchronize advance of the instruction in the first instruction pipeline and advance of the instruction in the second instruction pipeline at the "j"-th stage of the second instruction pipeline and the "i"-th stage of the first instruction pipeline, where "j"≦"m" and "i"≦"n".

2. A method of disabling an instruction in a pipelined computer having a first instruction pipeline and a second instruction pipeline, the method comprising the steps of:

detecting an exception of an instruction processed in the first instruction pipeline;

detecting a position of the instruction in the first instruction pipeline;

judging whether or not an identical instruction processed in the second instruction pipeline is to be disabled in response to the detected exception and to the detected position of the instruction in the first instruction pipeline; and disabling the instruction in the second instruction pipeline in response to a result of said judging step.

3. A method of synchronization in a pipelined computer having a first instruction pipeline, a second instruction pipeline, and a third instruction pipeline, the first instruction pipeline having "n" stages, the second instruction pipeline having "m" stages, the third instruction pipeline having "k" stages, the method comprising the steps of:

feeding an identical instruction to the first instruction pipeline, the second instruction pipeline, and the third instruction pipeline substantially simultaneously;

advancing the instruction in the first instruction pipeline;

advancing the instruction in the second instruction pipeline;

advancing the instruction in the third instruction pipeline;

detecting a position of the instruction in the first instruction pipeline;

stopping advance of the instruction in a "j"-th stage of the second instruction pipeline in response to the detected position of the instruction in the first instruction pipeline until the instruction reaches an "i"-th stage of the first instruction pipeline to synchronize advance of the instruction in the first instruction pipeline and advance of the instruction in the second instruction pipeline at the "j"-th stage of the second instruction pipeline and the "i"-th stage of the first instruction pipeline, where "j"≦"m" and "i"≦"n"; and stopping advance of the instruction in a "y"-th stage of the third instruction pipeline in response to the detected position of the instruction in the first instruction pipeline until the instruction reaches an "x"-th stage of the first instruction pipeline to synchronize advance of the instruction in the first instruction pipeline and advance of the instruction in the third instruction pipeline at the "y"-th stage of the third instruction pipeline and the "x"-th stage of the first instruction pipeline, where "y"≦"k" and "x"≦"n".

4. A method of disabling an instruction in a pipelined computer having a first instruction pipeline, a second instruction pipeline, and a third instruction pipeline, the method comprising the steps of:

detecting an exception of an instruction processed in the first instruction pipeline;

detecting a position of the instruction in the first instruction pipeline;

judging whether or not an identical instruction processed in the second instruction pipeline is to be disabled in response to the detected exception and to the detected position of the instruction in the first instruction pipeline;

disabling the instruction in the second instruction pipeline in response to a result of the judging step related to the second instruction pipeline;

judging whether or not an identical instruction processed in the third instruction pipeline is to be disabled in response to the detected exception and to the detected position of the instruction in the first instruction pipeline; and disabling the instruction in the third instruction pipeline in response to a result of the judging step related to the third instruction pipeline.

5. A method of synchronization in a pipelined computer having a first instruction pipeline and a second instruction pipeline, the first instruction pipeline having "n" stages, the second instruction pipeline having "m" stages, the method comprising the steps of:

feeding an identical instruction to the first instruction pipeline and the second instruction pipeline substantially simultaneously;

advancing the instruction in the first instruction pipeline;

detecting a position of the instruction in the first instruction pipeline;

advancing the instruction in the second instruction pipeline;

detecting a position of the instruction in the second instruction pipeline; and either stopping advance of the instruction in a "j"-th stage of the second instruction pipeline in response to the detected position of instruction reaches an "i"-th stage of the first instruction pipeline to synchronize advance of the instruction in the first instruction pipeline and advance of the instruction in the second instruction pipeline at the "j"-th stage of the second instruction pipeline and the "i"-th stage of the first instruction pipeline, where "j"≦"m" and "i"≦"n"; or stopping advance of the instruction in a "p"-th stage of the first instruction pipeline in response to the detected position of the instruction in the second instruction pipeline until the instruction reaches a "q"-th stage of the second instruction pipeline to synchronize advance of the instruction in the first instruction pipeline and advance of the instruction in the second instruction pipeline at the "p"-th stage of the first instruction pipeline and the "q"-th stage of the second instruction pipeline, where "p"≦"n" and "q"≦"m".

6. A method of disabling an instruction in a pipelined computer having a first instruction pipeline and a second instruction pipeline, the method comprising the steps of: either detecting an exception of an instruction processed in the first instruction pipeline;

detecting a position of the instruction in the first instruction pipeline;

judging whether or not an identical instruction processed in the second instruction pipeline is to be disabled in response to the detected exception and to the detected position of the instruction in the first instruction pipeline; and disabling the instruction in the second instruction pipeline in response to a result of said judging step related to the second instruction pipeline; or detecting an exception of another instruction processed in the second instruction pipeline;

detecting a position of said another instruction in the second instruction pipeline;

judging whether or not an instruction identical to said another instruction and processed in the first instruction pipeline is to be disabled in response to the detected exception and to the detected position of said another instruction in the second instruction pipeline; and disabling the instruction in the first instruction pipeline in response to a result of said judging step related to the first instruction pipeline.

7. A pipelined computer comprising:

a first instruction pipeline having a plurality of stages;

a second instruction pipeline having a plurality of stages;

a first instruction pipeline controller controlling the first instruction pipeline;

a second instruction pipeline controller controlling the second instruction pipeline;

a condition holding device including condition temporarily-holding devices provided in the stages of the second instruction pipeline respectively, and a condition generator generating a condition of the first instruction pipeline each time the first instruction pipeline advances; and means for monitoring the advance of an instruction in the first instruction pipeline via the condition holding device, and for controlling advance of an identical instruction in the second instruction pipeline in response to the monitored advance of the instruction in the first instruction pipeline.

8. The pipelined computer of claim 7 wherein the condition holding device comprises a counter device including a counter circuit and a count value temporarily-holding circuit.

9. The pipelined computer of claim 8 wherein the counter circuit comprises a down counter circuit.

10. A pipelined computer comprising:

a first instruction pipeline having a plurality of stages;

a second instruction pipeline having a plurality of stages;

a first instruction pipeline controller controlling the first instruction pipeline;

a second instruction pipeline controller controlling the second instruction pipeline;

a condition holding device including condition temporarily-holding devices provided in the stages of the second instruction pipeline respectively, and a condition generator generating a condition of the first instruction pipeline each time the first instruction pipeline advances;

an exception detector detecting an exception of an instruction processed in the first instruction pipeline;

a judgment section judging whether or not an identical instruction processed in the second instruction pipeline is to be disabled, based on the detected exception and a value of at least one of the condition temporarily-holding devices; and means for disabling the instruction processed in the second instruction pipeline in response to a result of said judging by the judgment section.

11. A pipelined computer comprising:

a first instruction pipeline having a plurality of stages;

a second instruction pipeline having a plurality of stages;

a third instruction pipeline having a plurality of stages;

a first instruction pipeline controller controlling the first instruction pipeline;

a second instruction pipeline controller controlling the second instruction pipeline;

a third instruction pipeline controller controlling the third instruction pipeline;

a first condition holding device including condition temporarily-holding devices provided in the stages of the second instruction pipeline respectively, and a condition generator generating a condition of the first instruction pipeline each time the first instruction pipeline advances:

a second condition holding device including condition temporarily-holding devices provided in the stages of the third instruction pipeline respectively, and a condition generator generating a condition of the first instruction pipeline each time the first instruction pipeline advances;

means for monitoring the advance of an instruction in the first instruction pipeline via the first condition holding device, and for controlling advance of an identical instruction in the second instruction pipeline in response to the monitored advance of the instruction in the first instruction pipeline; and means for monitoring the advance of an instruction in the first instruction pipeline via the second condition holding device, and for controlling advance of an identical instruction in the third instruction pipeline in response to the monitored advance of the instruction in the first instruction pipeline.

12. The pipelined computer of claim 11 wherein each of the first and second condition holding devices comprises a counter device including a counter circuit and a temporary count value-holding circuit.

13. The pipelined computer of claim 12 wherein the counter circuit comprises a down counter circuit.

14. A pipelined computer comprising:

a first instruction pipeline having a plurality of stages;

a second instruction pipeline having a plurality of stages;

a third instruction pipeline having a plurality of stages;

a first instruction pipeline controller controlling the first instruction pipeline;

a second instruction pipeline controller controlling the second instruction pipeline;

a third instruction pipeline controller controlling the third instruction pipeline;

a first condition holding device including condition temporarily-holding devices provided in the stages of the second instruction pipeline respectively, and a condition generator generating a condition of the first instruction pipeline each time the first instruction pipeline advances;

a second condition holding device including condition temporarily-holding devices provided in the stages of the third instruction pipeline respectively, and a condition generator generating a condition of the first instruction pipeline each time the first instruction pipeline advances;

an exception detector detecting an exception of an instruction processed in the first instruction pipeline;

a first judgment section judging whether or not an identical instruction processed in the second instruction pipeline is to be disabled based on the detected exception and a value of at least one of the condition temporarily-holding devices in the first condition holding device;

means for disabling the instruction in the second instruction pipeline in response to a result of said judging by the first judgment section;

a second judgment section judging whether or not another identical instruction processed in the third instruction pipeline is to be disabled based on the detected exception and a value of at least one of the condition temporarily-holding devices in the second condition holding device; and means for disabling the instruction in the third instruction pipeline in response to a result of said judging by the second judgment section.

15. A pipelined computer comprising:

a first instruction pipeline having a plurality of stages;

a second instruction pipeline having a plurality of stages;

a first instruction pipeline controller controlling the first instruction pipeline;

a second instruction pipeline controller controlling the second instruction pipeline;

a first condition holding device including condition temporarily-holding devices provided in the stages of the first instruction pipeline respectively, and a condition generator generating a condition each time the second instruction pipeline advances; and a second condition holding device including condition temporarily-holding devices provided in the stages of the second instruction pipeline respectively, and a condition generator generating a condition each time the first instruction pipeline advances; either means for monitoring the advance of an instruction in the first instruction pipeline via the second condition holding device, and for controlling advance of an identical instruction in the second instruction pipeline in response to the monitored advance of the instruction in the first instruction pipeline; or means for monitoring the advance of another instruction in the second instruction pipeline via the first condition holding device, and for controlling advance of an instruction identical to said another instruction in the first instruction pipeline in response to the monitored advance of said another instruction in the second instruction pipeline.

16. The pipelined computer of claim 15 wherein each of the first and second condition holding devices comprises a counter device including a counter circuit and a count value temporarily-holding circuit.

17. The pipelined computer of claim 16 wherein the counter circuit comprises a down counter circuit.

18. A pipelined computer comprising:
a first instruction pipeline having a plurality of stages;
a second instruction pipeline having a plurality of stages;
a first instruction pipeline controller controlling the first instruction pipeline;
a second instruction pipeline controller controlling the second instruction pipeline;
a first condition holding device including condition temporarily-holding devices provided in the stages of the first instruction pipeline respectively, and a condition generator generating a condition each time the second instruction pipeline advances;
a second condition holding device including condition temporarily-holding devices provided in the stages of the second instruction pipeline respectively, and a condition generator generating a condition each time the first instruction pipeline advances;
a first exception detector detecting an exception of an instruction processed in the first instruction pipeline; and a second exception detector detecting an exception of an identical instruction processed in the second instruction pipeline;

either
a first judgment section judging whether or not said instruction processed in the first instruction pipeline is to be disabled based on the exception detected by the second exception detector and a value of at least one of the condition temporarily-holding devices in the first condition holding device; and means for disabling said instruction in the first instruction pipeline in response to a result of said judging by the first judgment section;

or
a second judgment section judging whether or not another instruction processed in the second instruction pipeline is to be disabled based on the exception detected by the first exception detector for an instruction processed in the first instruction pipeline and identical to said another instruction, and a value of at least one of the condition temporarily-holding devices in the second condition holding device; and means for disabling said another instruction in the second instruction pipeline in response to a result of said judging by the second judgment section.

19. A pipelined computer comprising:
first and second instruction pipelines;
means for feeding an identical instruction to the first and second pipelines substantially simultaneously;
means for advancing the instruction in the first pipeline;
means for advancing the instruction in the second pipeline;
means for detecting a position of the instruction in the first pipeline; and
means for controlling advance of the instruction in the second pipeline in accordance with the detected position of the instruction in the first pipeline to synchronize advance of the instruction in the first pipeline and advance of the instruction in the second pipeline.

20. A pipelined computer comprising:
first and second instruction pipelines;
means for feeding groups of instructions to the first and second pipelines substantially simultaneously;
means for advancing the group of instructions in the first pipeline;
means for advancing the group of instructions in the second pipeline;
means for detecting an exception of at least one of the instructions in the group of instructions in the first pipeline; and
means for disabling at least one of the instructions in the group of instructions in the second pipeline identical to said at least one of the instructions in the group of instructions in the first pipeline in response to the detected exception.

* * * * *

UNITED STATES PATENT AND TRADEMARK OFFICE
CERTIFICATE OF CORRECTION

PATENT NO. : 5,428,756
DATED : June 27, 1995
INVENTOR(S) : Hisakazu EDAMATSU et al It is certified that error appears in the above-indentified patent and that said Letters Patent is hereby corrected as shown below:

On the title page, item [54] should read as follows:

--[54] METHOD AND APPARATUS FOR FEEDING IDENTICAL INSTRUCTIONS TO PLURAL PIPELINES AND CONTROLLING INSTRUCTION ADVANCE BY DETECTING PIPELINE STAGE POSITIONS OF THE IDENTICAL INSTRUCTIONS--

Signed and Sealed this

Third Day of October, 1995

Attest:

BRUCE LEHMAN

Attesting Officer

Commissioner of Patents and Trademarks